United States Patent [19]
Yokono et al.

[11] Patent Number: 5,300,735
[45] Date of Patent: Apr. 5, 1994

[54] INTERCONNECTED MULTILAYER BOARDS AND FABRICATION PROCESSES THEREOF

[75] Inventors: Hitoshi Yokono, Toride; Hideo Arima, Yokohama; Takashi Inoue, Yokohama; Naoya Kitamura, Yokohama; Haruhiko Matsuyama, Hiratsuka; Hitoshi Oka, Yokohama; Fumio Kataoka, Yokohama; Fusaji Shoji, Yokohama; Hideyasu Murooka, Yokohama; Masayuki Kyooi, Yokohama, all of Japan

[73] Assignee: Hitachi, Ltd., Tokyo, Japan

[21] Appl. No.: 37,543

[22] Filed: Mar. 22, 1993

Related U.S. Application Data

[63] Continuation of Ser. No. 672,117, Mar. 19, 1991.

[30] Foreign Application Priority Data

Mar. 19, 1990 [JP] Japan ............................ 2-069259
Nov. 30, 1990 [JP] Japan ............................ 2-330515

[51] Int. Cl.⁵ .................................................. I05K 1/00
[52] U.S. Cl. ..................................... 174/264; 174/250; 174/256; 174/262; 174/265; 361/792; 428/901
[58] Field of Search ............... 174/250, 256, 262, 264, 174/265; 361/414; 427/96, 97; 428/267, 901; 524/89, 90, 94, 96, 97, 98, 99, 100; 560/1, 8

[56] References Cited

U.S. PATENT DOCUMENTS

| | | | |
|---|---|---|---|
| 4,790,912 | 12/1988 | Holtzman et al. | 427/97 X |
| 4,946,734 | 12/1990 | Sugawara | 428/901 X |
| 4,999,449 | 3/1991 | Kirchhoff | 560/8 |
| 5,055,321 | 10/1991 | Enomoto | 427/96 X |

FOREIGN PATENT DOCUMENTS

| | | |
|---|---|---|
| 3641995 | 5/1988 | Fed. Rep. of Germany . |
| 50489 | 4/1982 | Japan . |
| 50490 | 4/1982 | Japan . |
| 50491 | 4/1982 | Japan . |
| 38157 | 7/1992 | Japan . |
| 38158 | 7/1992 | Japan . |

*Primary Examiner*—Leo P. Picard
*Assistant Examiner*—Cheryl R. Figlin
*Attorney, Agent, or Firm*—Antonelli, Terry, Stout & Kraus

[57] ABSTRACT

Described herein are interconnected mutilayer boards and their fabrication processes. Multilayer conductor lines of a skeleton structure are formed by conducting multilayer metallization while including all resist layers and metallic under-conductive layers and then removing the resist layers and metallic under-conductive layers at once. Spaces between the multilayer conductor lines of the skeleton structure are then filled with a solventless varnish so that insulating layers are formed. Modules making use of such interconnected multilayer boards and computers having such modules are also described.

25 Claims, 15 Drawing Sheets

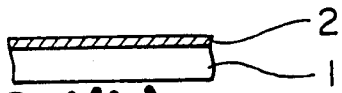
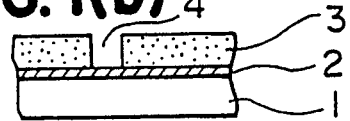
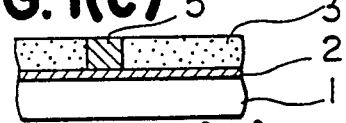
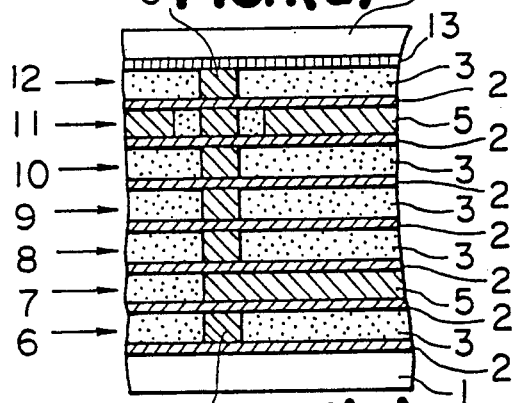
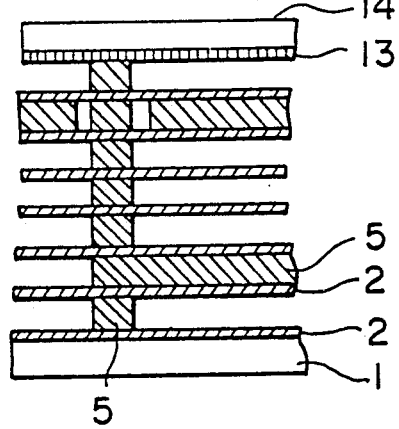
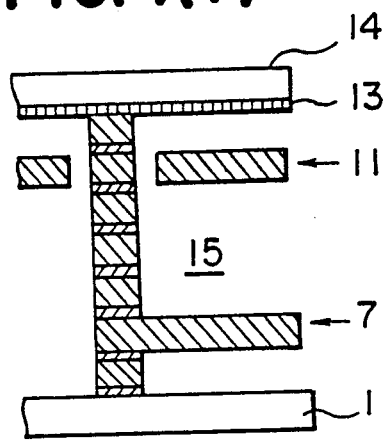
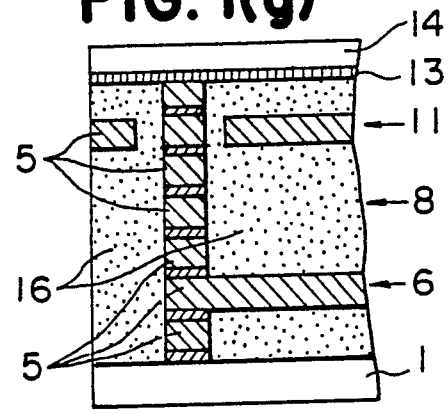
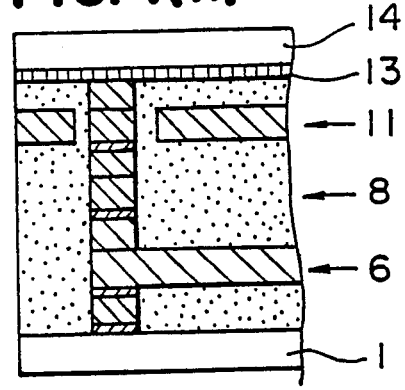

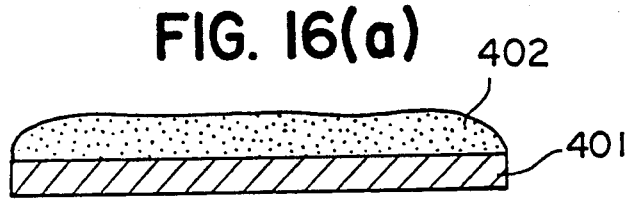
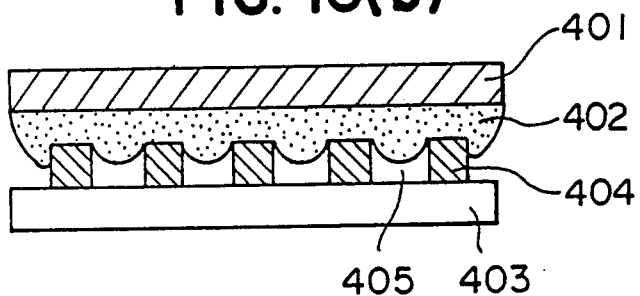
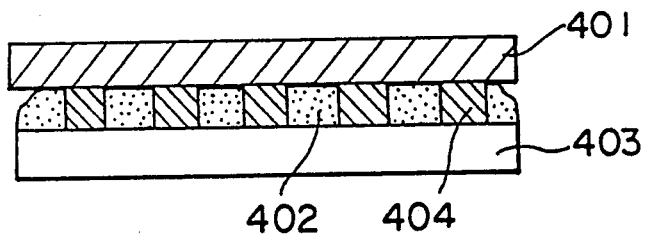

INTERCONNECTED MULTILAYER BOARDS AND FABRICATION PROCESSES THEREOF

This application is a continuation application of application Ser. No. 672,117, filed Mar. 19, 1991.

BACKGROUND OF THE INVENTION

1) Field of the Invention

The present invention relates to thin-film, interconnected multilayer boards for packaging very-large-scale integrated circuits (VLSI circuits), terminal resistors, capacitors, etc. at a high density and also to processes for their fabrication. Further, this invention is concerned with modules making use of such interconnected multilayer boards and also with computers having such modules.

2) Description of the Related Art

A conventional process for the fabrication of an interconnected multilayer board will first be described, taking by way of example the flow chart shown in FIGS. 9(a) through 9(g).

As is illustrated in FIG. 9(a), a metallic under-conductor layer 92 which can also serve as an electrode for plating is formed over the entire area of an upper surface of a substrate 91. On the upper surface of the metallic under-conductor layer 92, a resist 93 windowed in the form of a desired conductor line pattern is formed as depicted in FIG. 9(b). Plating is then conducted using, as electrodes, the metallic under-conductor layer 92 exposed in channels 94 so that, as shown in FIG. 9(c), the channels 94 in the resist 93 are selectively filled with a conductor to form conductors, via-hole conductors, of ground conductors 95. After the resist 93 is next removed to expose the conductors 95 as depicted in FIG. 9(d), the metallic under-conductor layer 92 is removed at portions other than the portions facing and contacting the conductors 95 as shown in FIG. 9(a). Next, as is illustrated in FIG. 9(f), an insulating layer 96 is formed with a polymer over the entire upper surface of the substrate 91 such that the conductors 95 are covered by the insulating layer 96. As is depicted in FIG. 9(g), by grinding or the like, the upper surfaces of the conductors 95 are exposed and the surface of the insulating layer 96 is formed into a flat surface. The above steps are repeated successively a plurality of times, whereby an interconnected multilayer board is fabricated.

Relevant technology is disclosed, for example, in Proceedings of the 34th ECC (Electronic Component Conference), 82–87 (1984).

The most serious problem of the above-described conventional technique resides in the need for the steps of forming and removing a resist, the steps of forming and removing a metallic under-conductor layer, the step of forming an insulating layer and the step of making the insulating layer flat for each of layers such as conductor layer, ground layer and via-hole conductor layer. The conventional technique therefore includes many steps, resulting in long lead time and poor mass productivity.

The conventional technique is accompanied not only by the need for such many steps but also by many other problems such as the inclusion of technically troublesome steps, for example, the need for grinding and polishing of an insulating polymer layer and the difficulties in the elimination of dust particles such as grinding and polishing powder by washing.

SUMMARY OF THE INVENTION

The present invention has been completed with a view toward fully overcoming the above-described problems such as the need for such many steps and the problems of grinding and polishing. An object of the present invention is therefore to provide an interconnected multilayer board which requires much fewer fabrication steps and a significantly-shortened lead time, does not require grinding and polishing step and has excellent mass productivity and also a fabrication process thereof.

Although the conventional fabrication process shown in FIG. 9(a) through 9(g) is the best in throughput among those proposed to date, its lead time is still not practical. To use that process for mass production, it is necessary to improve the throughout further and shorten the lead time to about $\frac{1}{2}$ to $\frac{1}{3}$. The significantly long lead time can be attributed to the use of a polyimide resin as a polymer for the formation of insulating layers. When a polyimide material undergoes a curing reduction under heat, both solvent and water evaporate so that the polyimide material shrinks along the ruggedness of a base. The resultant polyimide insulating layer therefore has very poor flatness, whereby grinding and polishing are indispensable. Further, to form an insulating film, the polyimide material is first formulated as a polyamic acid solution or polyimide solution, followed by coating and heating. No desired film thickness can therefore be obtained by a single coating operation, so that many steps such as coating and drying steps are hence required. In addition, curing of the polyimide material requires high temperature and long time.

Another object of the present invention is to provide an interconnected multilayer board which, owing to the adoption of a material permitting short-time curing and having extremely good flatness, allows to improve the throughput 2–3 times and to shorten the lead time to $\frac{1}{2}$ to $\frac{1}{3}$ or even less and is excellent in mass productivity and also its fabrication process. A further object of the present invention is to substantially shorten the development and manufacturing period of modules and hence that of a computer and to impart high reliability to them.

To overcome the problems described above, the present invention provides a breakthrough process in which multilayer metallization is conducted with all resist layers and metallic under-conductor layers left as they are without performing layer-by-layer removal of resist or polymer layers with a solvent and of metallic under-conductor layers by etching, the resist layers and metallic under-conductor layers are removed at once to form multilayer conductor lines of a skeleton structure, and spaces between the multilayer conductor lines of the skeleton structure are filled with a varnish in a solventless form thereby to form insulating layers. Upon formation of multilayer conductor lines, it is difficult to form a conductor metal alone into multiple layers at once by a conventional process without relying upon the assistance of a brazing material. From the standpoint of the reliability of connection of conductors, there is hence no choice other than relying upon a successive stacking process by making use of plating or the like. To form a conductor metal into multiple layers, it is most efficient and rational to apply one of successive processes, said process requiring the shortest time. On the other hand, insulating layers can be formed either successively or at once. It is hence most desirable to apply a simultaneously forming process which is efficient and rational. The foregoing is the fundamental concept which the present invention has proposed to overcome the problem that a fabrication process of a thin-film, interconnected multilayer board requires a lot of time for its practice.

In the present invention, the term "a solventless varnish" mans not only a so-called solventless type varnish which is in a liquid state at room temperature under no pressure, but also a varnish which melts and flows smoothly without solvent at a temperature not higher than the curing temperature under pressure or no pressure.

BRIEF DESCRIPTION OF THE DRAWINGS

FIGS. 1(a) through 1(g) show a flow chart of a process according to one embodiment of the present invention, which is suitable for use in the fabrication of an interconnected multilayer board;

FIGS. 16(a) through 16(c) illustrate a flow chart of a process for filling spaces between adjacent conductors with a resin material, such as a poly(benzocyclobutene) polymer or a heat-resistant epoxy resin, by using a hot plate.

DETAILED DESCRIPTION OF THE INVENTION AND PREFERRED EMBODIMENTS

Figure 2:
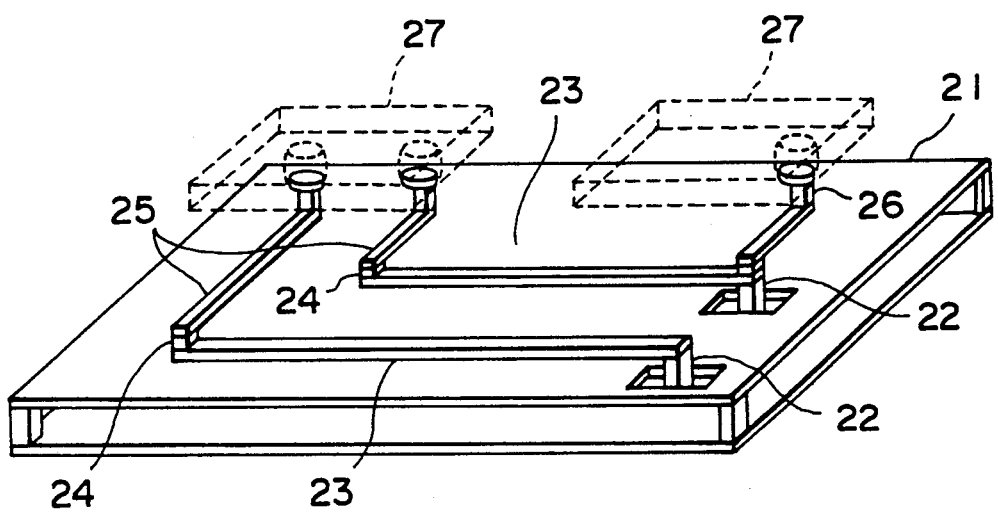
FIG. 2 is a perspective view illustrating an exemplary substrate which has a large area and is suitable for use in the practice of the present invention.

A process according to one embodiment of the present invention, which is suitable for use in the fabrication of an interconnected multilayer board, will now be described on the basis of the flow chart of FIGS. 1(a) through 1(h).

As is shown in FIG. 1(a) a metallic under-conductor layer 2 is formed on the whole area of an upper surface of a base substrate 1 which may optionally contains conductor lines in multiple layers. The metallic under-conductor layer 2 can serve as an electrode for electroplating or as a base film for electroless plating. On an upper surface of the metallic under-conductor layer 2, a resist 3 windowed in the form of a desired conductor line pattern is formed as shown in FIG. 1(b). Plating is then conducted using the metallic under-conductor layer 2, which is exposed through the window 4, as an electrode for electroplating or as a base film for electroless plating, whereby as is depicted in FIG. 1(c), the window 4 of the resist 3 is selectively filled with a conductor to form a via-hole conductor 5, so that a first layer is formed. Up to this stage, the fabrication process is the same as the conventional process.

Next, without conducting removal of the resist and that of the metallic under-conductor layer, the steps from FIG. 1(a) to FIG. 1(c) are, as 1 cycle, repeated plural times to form a multilayer structure. In a multilayer structure of n levels, n≧2 when via-hole, X, Y and ground layers are each counted as 1 layer. To make the thickness of plating uniform and to provide an electrode for electroplating or a prime layer for electroless plating for the formation of conductor lines, a metallic under-conductor layer is required underneath each of X, Y and ground layers. Absence of any metallic under-conductor layer underneath via-hole layers provided on their upper sides, respectively, does not cause any particular problem because the metallic under-conductor layers of the X, Y and gland layers can be used as electrodes or the X, Y and gland layers per se can be used as prime layers for plating. This however does not preclude the provision of metallic under-conductor layers underneath the via-hole layers.

In the interconnected multilayer board shown in FIGS. 1(a) through 1(h), the first layer is used as a via-hole layer. The first layer can however be used as a conductor layer for the X and Y layers or as a ground layer rather than the via-hole layer. It is not essential for the conductor layer to extend at right angles relative to the X and Y layers. It may be formed as a conductor-line-containing layer which extends at an oblique angle.

It is possible to omit the metallic under-conductor layer under the intermediate via-hole conductor layer if, upon formation of the intermediate via-hole conductor in the above fabrication process, the underlying conductor can be used as an electrode for electroplating or a base film for electroless plating because the metallic under-conductor layer remaining under the conductor practically serves as the electrode for electroplating or the base film for electroless plating.

The multilayer structure of FIG. 1(d) has nine layers (n=7), which comprises the via-hole 6, the X layer 7, the via-hole layer 8, the Y layer 9, the via-hole layer 10, the ground layer 11 and the via-hole layer 12. If necessary, a fixing plate 14 can be attached over the uppermost layer via a support layer 13, such as a mesh, interposed therebetween after such a multilayer structure has been formed.

Next, as shown in FIG. 1(e), all the resist layers are removed at once with a solvent. Further, as illustrated in FIG. 1(f), all the metallic under-conductor layers are removed at once with an etchant. The removal of the resist layers and that of the metallic under-conductor layers can be reversed in order. They can be removed layer by layer alternately. As a further alternative, they can be removed at once. By removing the resist layers and the metallic under-conductor layers as described above, there are formed multilayer conductor lines of a skeleton structure as shown in FIG. 1(f). The multilayer conductor lines of the skeleton structure contains a space 15. To copper conductor lines, plating of a different kind, for example, Ni plating can be applied here.

The multilayer conductor lines of the skeleton structure is then placed within a box-like enclosure and, as is illustrated in FIG. 1(g), the space 15 is subjected to defoaming and is wholly cast and filled with an insulating varnish 16 in a solventless form under reduced pressure, normal pressure or elevated pressure or under a combination of two or more of these pressure conditions, followed by curing to fabricate an interconnected multilayer board. Where no metallic under-conductor layer is provided underneath the intermediate via-hole conductor layer, the step corresponding to that illustrated in FIG. 1(g) can be illustrated as shown in FIG. 1(h). The injection of the varnish is performed through gaps at the four sides of the box-like enclosure or through the top of the box-like enclosure. If the fixing plate 14 is formed of a net, a perforated plate, a grid or the like, the injection of the varnish can be performed downwardly through the fixing plate 14. After the at-once filling of the varnish in the solventless form, the varnish in the solventless form is cured while fixedly holding an end of the upper via-hole by a jig. As the jig, is used a plate, for example, a glass plate with a hole formed at a location aligned or registered with the position of the via-hole, Instead of casting and filling the varnish, the space 15 of the multilayer conductor lines of the skeleton structure can be impregnated with a solvent-based insulating varnish so that the conductors can be coated and insulated at once. It is also possible to use in combination the coating of the conductors with the solvent-based varnish and the casting and filling of the varnish in the solventless form. Further, the injection of the varnish in the solventless form can be performed by liquid injection. A a solvent-base varnish can be molten and pressed to mold the multilayer group of conductors. The varnish in the solventless form may contain one or more fillers. Although fillers employed for plastic molding are useable by way of example, silica beads, mullite beads, fibrous materials and polyimide powder are also suitable. To improve the coatability of the varnish in the solventless form, it is possible to add an organic compound of a low molecular weight to extent impairing neither the defoaming processing nor the void formation free conditions for films to be coated. Such organic compounds can be added in the present invention.

Needless to say, it is to be noted that the above-described process of the present invention for the fabrication of an interconnected multilayer board can be used in combination with one or more other fabrication processes and interconnected multilayer boards fabricated by the above-described process of the present invention can be connected together with a brazing material.

A description will hereinafter be made of materials useful for various portions in the process of the present invention for the fabrication of the interconnected multilayer board.

In the present invention, the base substrate 1 may include or may not include one of more signal layers. Its material may be a ceramic or polymer provided that the ceramic or polymer has insulating property as a substrate. No particular limitation is therefore imposed on the material of the base substrate 1.

The material of the metallic under-conductor layers 2 must serve as an electrode for electroplating or a base film for electroless plating and must be etched off by a particular etchant. The metallic under-conductor layers 2 can be formed, for example, by applying layer of a metal such as Cr/Cu/Cr, Ti/Cu/Ti, Ti, Cu, Zn, Sn, Co, Fe, Ni, Ni/Cu, Rh or In using methods such as vacuum deposition, sputtering, ion plating, electroless plating and electroplating either singly or in combination. They may also be formed of films of an organic conductor.

The plating resists 3 may be a varnish-type, electrodeposition-type or film-like resist irrespective of whether it is inorganic or organic, provided that it can be moved subsequently with a particular solvent. It may be either sensitive or insensitive to light. It can be selected, for example, from photoresists, photosensitive polyimides, various photo-insensitive polymers, ceramics, glasses, and metal films such as Zn, Cu and Ni films provided that, in the case of the metal films, an insulating layer is provided at the interface with the associated metallic under-conductor layer. In the case of film-like resists, there are film-like resists having adherence by themselves and those coated with an adhesive or a sticking agent. The resists may be windowed in advance in a separate line. As the window-forming method for the resists, conventional photolithography, laser beam machining, wet etching or dry etching can be used suitably.

Examples of the conductor metal filled in the windows 4 formed in the resists 3 include those employed for the formation of conventional conductors and via-hole (through-hole) conductors, such as Au, Ag and Cu.

On the support layer 13 arranged on the conductor lines in the uppermost layer, the fixing plate 14 is built up by plating or is connected with solder. The support layer 13 is to support the group of wires in the lower layers without allowing their movements. The support layer 13 is formed by vacuum depositions, sputtering, plating or the like. The support layer 13 and fixing plate 14 are dissolved neither during the step of the solvent removal of the resist layers nor during the step of the etching removal of the metallic under-conductor layers. so that they serve to fix the upper surface of the uppermost via-hole conductor during the injection step of varnish subsequent to the formation of the skeleton structure. For example, an Ni, Ni alloy, Cr, Ti, alumina, mullite, zirconia or polyimide plate can be used although not necessarily limited thereto.

A solvent-based varnish is used to coat the conductors of the skeleton structure while a varnish in a solventless form is employed to cast and fill them. Each of these varnishes contains its components in any form such as monomers, an oligomer or a polymer.

Illustrative of the solvent-based varnish include solvent-based varnishes of aromatic or non-aromatic polymers such as fluoropolymers, silicones, polyimides, polyamideimides, polyesterimides and polybenzimidazole. To improve the signal propagation velocity by a lowered dielectric constant, a fluoropolymer is effective. Exemplary fluoropolymers include emulsion-type PTFE, PFA, FEP, amorphous AF, etc.

Usable examples of the solventless varnish injected into the space of the conductors of the skeleton structure include epoxy resin (in particular, epoxy resins of the naphthalene skeleton, biphenyl skeleton or terphenyl skeleton), isocyanurate- oxazolidone resins, isocyanate ester resins, and heat-resistant polymers having cyclobutene rings. From various requirements such as low dielectric constant ($\epsilon < 2.7$), high heat resistance ($>350°$ C.), high efficiency of casting work and high flatness, heat-resistant polymers containing cyclobutene rings or heat-resistant epoxy resins are particularly preferred. As heat-resistant polymers containing cyclobutene rings, those disclosed in Japanese Language Laid-Open Publication (PCT) No. SHO 60-501572 can be used by way of example. A description is made here of the heat resistance which a polymer in a solventless form should have. Upon construction of an interconnected multilayer board into a module, solder connection is needed for various layers. Accordingly, the interconnected multilayer board must withstand the maximum temperature to which it is exposed in the course of the soldering process. In the case of computer modules most sophisticated among those available these days, the heat resistance must be at least 250° C., desirably 280° C. or higher in terms of glass transition point (Tg). Polymers which can meet this condition are used in the present invention.

The use of the varnish in the solventless form can bring about the following advantageous effects.

Namely, use of a solvent-based polymer such as a polyimide results in a coating film having voids or pinholes because of the existence of a remaining solvent and the formation of water by condensation occurred as a result of curing. Further, a base substrate generally includes many avoids as surface defects. It is difficult to fill up these voids even if a solvent-based varnish is coated repeatedly several companied by the problems that coating films inferior in flatness can only be provided and many voids remain unfilled in a substrate because the solvent-based polymer has a high viscosity despite of its low concentration. In contrast, a varnish in a solventless form does not contain any volatile component and does not produce byproducts such as water upon polymerization. The varnish in the solventless form is therefore free from the formation of pinholes or voids. In addition, it permits depressurization and/or pressurization upon injection as no volatile components are produced, thereby making it possible to fill up even small holes. Especially, in the case of a heat-resistant polymer containing cyclobutene rings or a heat-resistant epoxy resin, excellent flatness is provided. When coated on a warped substrate, the resulting coating film can absorb the warpage to easily correct the deformation. Further, a polymer which does not contain any imide rings or, even when imide rings are contained, contains them in an extremely small proportion as the imide rings are not a predominant component is inert even when brought into direct contact with copper and has no potential danger of copper corrosion. Namely, such a polymer is also safe from the standpoint of electromigration. In addition, the advantage that curing is feasible at a lower temperature in a short time compared with conventional polyimides (final curing temperature: 300°-400° C.) is also valuable. Heat-resistant epoxy resins usable in the present invention are fully cured, for example, at 150°-200° C.

For the advantageous effects described above, short circuit or open (circuit interruption) of conductor lines due to voids and/or pinholes is not observed although such a problem is observed in the case of conventional solvent-based polymers. As has been described above, the varnish in the solvent form can prevent occurrence of electromigration, can realize pinhole-free insulation and can be used suitably for flattening a bas substrate upon fabrication of an interconnected multilayer board.

When the varnish casting is conducted through a net, perforated plate, grid or the like provided on the top as described above, a polymer-made rough surface is formed on the upper surface of the interconnected multilayer board when the net or the like is removed after the casting. The varnish in the solventless form can also be used for flattening the rough surface.

Another important effect of the varnish in the solventless form is that thickening is feasible. In the case of a solvent-based polymer, thickening requires building up of the polymer while causing the solvent to evaporate and is hence cumbersome. Although the solvent-based polymer can be bonded and stacked on the base substrate in the lower part, it cannot bond a substrate in an upper or intermediate part at the same time as the curing. The varnish in the solventless form does not contain any solvent and produces no byproduct upon curing. It therefore permits simultaneous bonding and building-in of many substrates, to say nothing of thickening. This means that inorganic insulating sheets or substrates such as those made of ceramics, said sheets or substrates conforming in expansion coefficient with LSIs of a small expansion coefficient, can be bonded on an upper layer of a modulate substrate. For LSIs of large heat generation, a substrate having excellent thermalconductivity such as an AlN substrate can be bonded to a top part. The solventless varnish can bring about another advantageous effect. In separate off-line steps, thin-film resistor can be formed on a ceramic sheet or substrate and heat-treated at a temperature higher than the heat-resistant limit of the varnish in the solventless form, and its resistance value can be adjusted by trimming. The resistor can then be bonded as an integral element to a thin-film, interconnected multilayer board.

To fill the varnish in the solventless form as described above, it is necessary to surround the four side walls of the module substrate. Usable examples of an enclosure include metal plates and RTV rubber plates, which have been treated with a parting agent. The filling method of the solventless varnish is not limited to these methods. It is also possible to form sealing walls on the four sides at the same time as the formation of conductors on the base substrate by plating. In addition to the four sides of the base substrate, a shielding film for the group of internal conductor lines can also be formed on the upper surface layer.

When the substrate fabricated in the above-described manner has a significantly large area, for example, when, as shown in FIG. 2, elongated X-layer conductors 23 connected to corresponding via-hole conductors 22 on a base substrate 21 are connected to corresponding Y-layer conductors 25 via associated via-hole conductors 24 and are connected further to associated semiconductor layers 27 by way of corresponding via-hole conductors 26 in the next layer, the conductor lines of the skeleton structure are not fixed at one ends so that the dimensions of the conductor lines may not be controlled at predetermined values in the space.

As measure for this potential problem, the present invention proposes a variety of methods for providing a spacer as a support for the conductor lines.

As a method for supporting the conductor lines, there is a method for forming spacers upon formation of conductor lines in addition to the method in which spacers ar simply physically inserted between the conductors lines.

According to the method for physically inserting spacers, upon formation of conductor lines of a skeleton structure as illustrated in FIG. 1(f) by way of example, spacers can be inserted at some places in the space of the skeleton, for example, between the X layer and the Y layer. Insofar as the material of the spacers themselves has insulating property sufficient to maintain the insulation between the conductor lines, the insulating material may be either organic or inorganic. Usable exemplary insulating materials include ceramics, glass and varnishes.

Figure 3A:
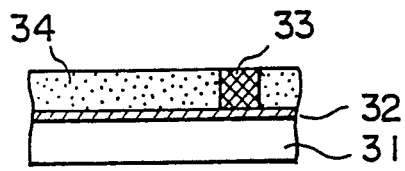
FIGS. 3(a) through 3(e) depict a flow chart of a process according to another embodiment of the present invention, which is suitable for use in the fabrication of an interconnected multilayer board having spacers.
Figure 3B:
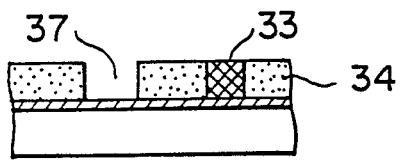
Figure 3C:
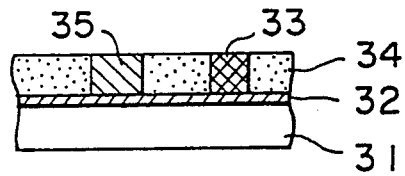
Figure 3D:
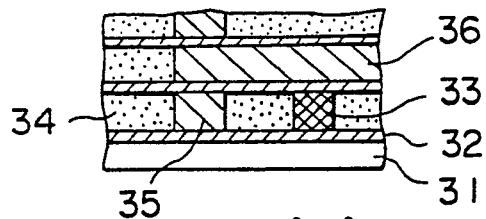
Figure 3E:
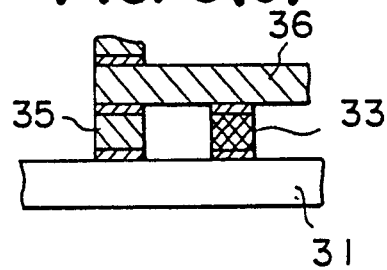

A more efficient and rational method than the method described above is to form spacers at once by photolithographically patterning a polymer before coating a resist. Namely, as shown in FIG. 3(a), after a metallic under-conductor layer 32 is formed on a base substrate 31 (although it is not absolutely necessary to form the metallic under-conductor layer 31 directly on the base substrate 31 as a base electrode), a photoresist 34 is patterned to form a spacer 33. Next, as illustrated in FIG. 3(b), the photoresist 34 is windowed by dry etching to form a window 37. Copper plating is then applied to the window 37 as depicted in FIG. 3(c), whereby the window 37 is filled with a conductor 35. Further, as depicted in FIG. 3 (d), conductor lines 36 are formed on the conductor 35. As shown in FIG. 3(e), the portions of the metallic under-conductor layer 32 ,said portions being other than those maintained in contact with a lower part of the conductor, and the resist 34 are removed by etching, so that a skeleton structure is formed.

In this case, the polymer forming the spacer 33 must be resistant to the specific solvent employed to remove the resist and also to the etchant used to remove the metallic under-conductor layer. As a result, when the skeleton structure is formed as described above, the spacer 33 remains in the space of the skeleton to support the conductor lines 36.

Where the resist is a photosensitive polyimide, the resist is cured by laser heating so that the spacer portion is formed. Channels for conductor lines can then be formed by photo-exposure and development. This method can be used where a polymer having two functions of heat polymerizability and light polymerizability is used.

Figure 4A:
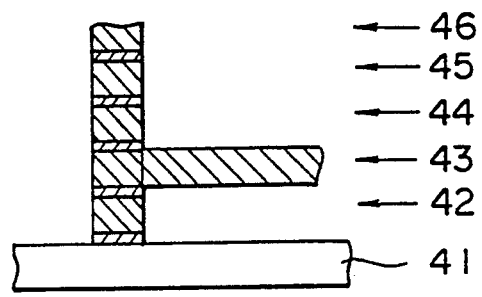
FIGS. 4(a) through 4(c) show a flow chart of a process according to a further embodiment of the present invention, which is suitable for use in the fabrication of an interconnected multilayer board having spacers.
Figure 4B:
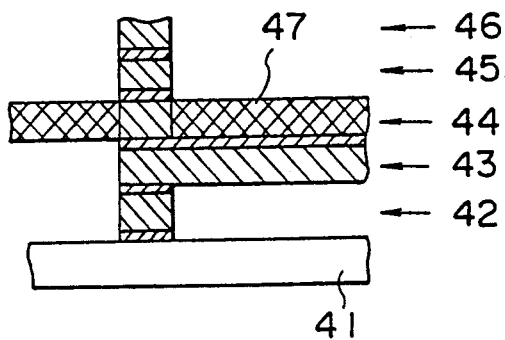
Figure 4C:
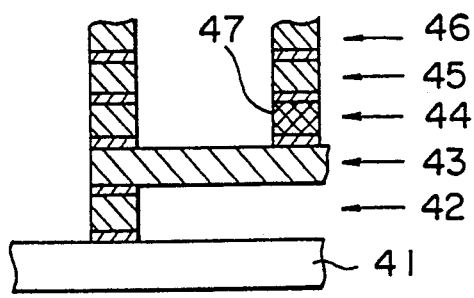

As another embodiment, there is a method in which the portion between the X layer and the Y layer, said portion being to become a spacer for the via-hole conductor layer, is filled wholly or partly with a polymer. For example, conductor lines of a skeleton structure may be such construction that conductor layers and via-hole layers are alternated like a via-hole layer 42→an X layer 43→a via-hole layer 44→a Y layer 45→a via-hole 46 as illustrated in FIG. 4(a). In FIG. 4(b), after the formation of the X layer 43 as shown in FIG. 4(a), the portion adapted to become the space for the via-hole layer 44 between the X layer 43 and the Y layer 45 is filled wholly with a polymer to form a spacer 47. Incidentally, a via-hole extending to the Y layer is formed by laser-machining the spacer 47 to form a window therethrough and then plating the window with a conductor to fill the window the conductor. As an alternative, as shown in FIG. 4(c), the space can be partially filled with a polymer to form the spacer 47.

The polymer filling can be effect in the form of a net or a grid. In this case, the polymer which forms the spacer should be resistant to a specific solvent to be employed for the removal of the resist and also to a particular etchant to be employed for the removal of the metallic under-conductor layer. A photosensitive polymer such as a photosensitive polyimide, an insoluble, heat-resistant polymer such as a conventional polyimide or a heat-resistant polymer containing cyclobutene rings, a heat-resistant resin containing cyanate ester rings, or the like is suitable. As a result, upon simultaneous removal of the resists and the metallic under-conductor layers, the polymer is allowed to remain as a spacer so that the X layer and the Y layer ar fixed by the polymer.

To form the spacer in the form of a net or a grid, photolithiography, laser machining, dry etching or the like can be used by way of example.

It has been described to form a spacer in the via-hole layer between the X layer and the Y layer. It is however to be noted that the layer in which one or more spacers are to be formed is not limited to the above layer but can be formed in any conductor layers.

In the above-described method, the formation of the polymer layer to be used as the spacer can be efficiently conducted by using a heat-resistant polymer film which carries a metallic under-conductor layer provided thereon and has been subjected to via-hole formation. In addition, it is also possible to use an inorganic insulating film, such as a ceramic or glass film, instead of the polymer film by bonding the inorganic insulating film to a metallic under-conductor layer.

In a thin-film process, it is also possible to form one or more spacer with a metal different from the material of conductor lines concurrently with the formation of conductors by plating. In this case, the spacers must be insulated from the conductor lines. For this purpose, insulating treatment can be applied by a CVD process or the like.

As a further method, there is a method in which walls (or columns) a reformed by plating on the four sides of a base substrate concurrently with the formation of conductors by plating, conductors like antennas are extended from end or intermediate portions of the conductors and are connected to the walls, the walls are removed after subsequent fixing of the group of the conductors, and the conductors as the antennas are separately cut off at their basal portions by laser or the like.

Figure 5A:
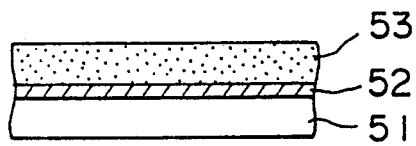
FIGS. 5(a) through 5(g) show a flow chart of a process according to a still further embodiment of the present invention, which is suitable for use in the fabrication of an interconected multilayer board having spacers.
Figure 5B:
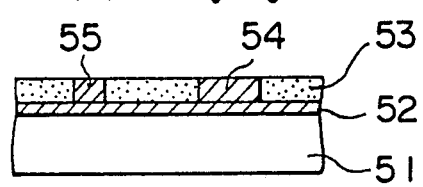
Figure 5C:
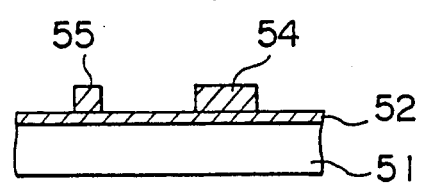
Figure 5D:
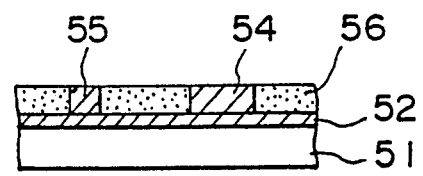
Figure 5E:
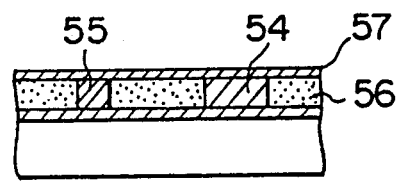
Figure 5F:
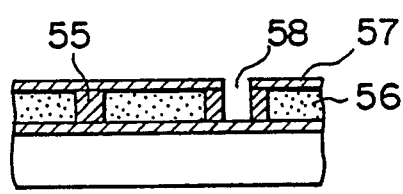
Figure 5G:
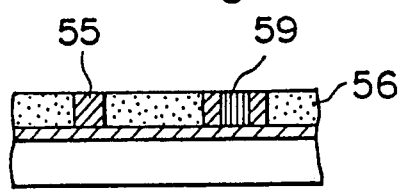

There is a still further method in which both a spacer and a via-hole forming window are formed with a heat-resistant polymer by a thin-film process and the other portions are filled up by plating. For example, as is shown in FIG. 5(a), a metallic under-conductor layer 52 of Cr/Cu/Cr is formed by sputtering on a base substrate 51, followed by the formation of a photosensitive polyimide layer 53. The polyimide layer 53 is exposed as illustrated in FIG. 5(b) and then developed as depicted in FIG. 5(c), whereby a via-hole forming portion 54 and a spacer 55 are formed. Next, as shown in FIG. 5(d), there is plated a metal 56 which can be etched selectively from conductors. Referring next to FIG. 5(e), masking is applied with a mask 57 resistant to dry etching. The masking 57 is exposed and developed only at a location above the via-hole forming portion 54. Next, as is shown in FIG. 5(f), a via-hole forming window 58 is formed by dry etching. Further, as is depicted in FIG. 5(g), a conductor 59 to be employed for conductor lines purposes is filled in the via-hole window 58 after the mask has been peeled off.

When copper is used as the conductor 59, the metal 56 which can be etched selectively therefrom can be zinc by way of example. The zinc is subsequently dissolved off with etchant so that is forms a space when a skeleton structure has appeared.

Although a photosensitive polyimide is employed in FIGS. 5(a) and 5(b), it is possible to bond a film of a photo-insensitive, heat-resistant polymer, for example, a polyimide film and then to subject the film to dry etching, or to form a polymer, which corresponds to the spacer polymer and the via-hole portion, to perform via-hole machining by laser micro-machining. It is also possible to form a spacer with a heat-resistant polymer while using a photoresist excellent in flatness, to fill up the remaining channels with a photoresist and then to form a via-hole window in the photoresist by a lithographic technique.

Various methods have been described for the formation of spacer or spacers. They can be used either singly or in combination. Further, other methods can also be used insofar as the skeleton can be held.

In the methods described above, the expressions "specific solvent" and "particular etchant" are used in some instances to mean that a solvent and an etchant corresponding to the resist and the metallic under-conductor layer, respectively, are used. The solvent and the etchant therefore specifically dissolve the resist and the metallic under-conductor layer, respectively. No other particular limitation is imposed. For example, upon filling with a polymer the via-hole layer between the X layer and the Y layer in the above-described method in which the spacer is formed at the same time by using the thin-film process, the polymer must be resistant to both the solvent and the etchant. In this sense, the specific solvent and the particular etchant selectively dissolve their corresponding resists and prime metal film.

The present invention not only simplifies the process and naturally improves the reliability and yield but also brings about substantial effects for the improvement of the performance. One example will next be described below.

A metallic under-conductor layer soluble by a particular etchant is formed on a base substrate as an electrode for electroplating or as a prime layer for electroless plating. A resist layer which has been windowed in the form of the pattern of conductors and is soluble in a specific solvent is provided on the metallic under-conductor layer, and the interior of the window is plated to fill the window with a conductor. This operation is repeated n times to conduct multi-layer metallization. In an intermediate stage of the process, at the end of the process or in a stage close to the end of the process, a conductor layer made of an insulating material insoluble in the specific solvent is provided. The conductor layer made of the insulating material has capacitors and resistance elements made of $CrSiO_x$ or $TaSiO_x$, said capacitors and resistance elements being either mounted on or built in the conductor layer. Before or after the formation of the conductor layer made of the insulating material, the plating resists and the metallic under-conductor layers are dissolved off to form multilayer conductor lines of a skeleton structure. Space of the skeleton structure is filled with a solventless varnish, or the conductor lines are coated with a solvent-based varnish and space of the skeleton is impregnated with the solventless varnish. Or, the solventless varnish and the solvent-based varnish can be used in combination.

One of major features of the process according to the present invention resides in that functional devices can be provided freely not only on the base substrate but also on or near the upper surface of the interconnected multilayer board or at an intermediate location as described above.

Further, the windowing for the formation of conductor lines, via-holes and the like can be performed by photolithography, laser machining, wet etching, dry etching or the like. In addition, patterns of plating resists and spacers are formed by high-accuracy photolithographic technology or a mask for forming such patterns is formed by a printing method. Windowing can be carried out in the above-described manner.

In addition, to overcome the problems caused by the use of a polyimide material for each insulating layer in the conventional processes, the present invention also features the use of a poly(benzocyclobutene) polymer or a heat-resistant epoxy resin as a resin for the formation of each insulating layer. Each insulating layer is formed by filling the space between the corresponding conductors with a poly(benzocyclobutene) polymer precursor or an epoxy resin composition and then curing the precursor or composition.

In the conventional pedestal process, it has been known to use, as polymers, polyimides in the form of solvent-based varnishes by way of example. Polyimides are used because, inter alia, they have the highest heat resistance (glass transition point and thermal decomposition temperature) among polymers available on the market, their mechanical properties are superb when formed into films, and their linear expansion coefficients can be rendered equal to that of Al or Cu employed as a conductor metal. Polyimides are however accompanied by various problems such that they have to be dissolved in a solvent prior to their use due to their high molecular weights, they have to be provided in the form of precursors, i.e. amidic acids to permit their dissolution, their curing reactions require both high temperature and long time, they give off water due to condensation upon curing, they can be dissolved only at a low solute concentration, and they are inferior in flatness. These problems have considerably deteriorated the productivity of interconnected multilayer boards. These merits and demerits of polyimides re summarized in Table 1.

TABLE 1

| Objective | Properties required for inter-layer insulating films | Achievement by current polyimides |
|---|---|---|
| Reduction of fabrication period (8 months or more → 3 months or less) | Flatness | C |
| | Thick coatability | C |
| | Fast curability | C |
| | Hole filling ability | C |
| Higher fabrication yield (yield → 100%) (To meet the trend toward boards of larger area) | Low α property | B-A |
| | Formability of pinholeless film | C |
| | Heat resistance | A |
| | Mechanical properties | A |
| | Adhesion | B-A |
| Reduction of transmission delay time | Low ε property | B |

A: excellent, B: good, C: poor.

As a promising method for overcoming the above-described various problems of polyimides, the present inventors came to the conclusion that development of new polymers usable in a solventless state would be indispensable for the fabrication of interconnected multilayer boards. This had never been thought of in the field of interconnected multilayer boards, especially in the field of stepwise interconnected multilayer boards. As possible reasons, it may be considered that no interconnected multilayer boards of large area and ultramultilayers had been needed, polyimides had attracted much attention only for their favorable properties and their drawbacks had not been recognized as drawbacks, and no solventless varnishes having properties sufficient to replace polyimides had been found in the history of polymers. Although various solventless varnishes are dealt with in the present invention, polymers containing cyclobutene rings and having especially good heat resistance (glass transition point $\geq 330°$ C., thermal decomposition temperature $\geq 400°$ C.) have been investigated as solvent-based varnishes and have not been studied as solventless have fast curability at low temperatures (curable at 150°-200° C.). There have been actually used to certain large extent as solventless varnishes. There has however not been known any epoxy resin composition which has heat resistance higher than 200° C. and is in a solventless form. In particular, there has not been known any epoxy resin composition which can be meet the heat resistance required for thin-film, interconnected multilayer boards for computers, namely, which has a glass transition point of at least 230° C., desirably 260° C. for higher, and notably 300° C. or higher. Upon designing the molecular structure of a polymer for use in the present invention, much consideration was taken such that filling would be successfully effected by casting the polymer or by causing the polymer to melt and flow even in the case of the specification (for example, width: 25 μm, height: 40 μm, pitch; 35 μm) for conductor lines of thin-film, interconnected multilayer boards for computers. As a prerequisite for each polymer usable in a solventless form in this invention, the polymer must be in a liquid form at temperatures not higher than 180° C. or in a melted, flowable form at temperatures not higher than 280° C. or its curing temperature when pressurized. Since the curing reaction can be carried out at a lower temperature in a shorter period of time compared with polyimides, the polymer is suitable, from the standpoint of increasing the productivity, for interconnected ultramultilayer boards which require repetition of multilayer metallization. Further, a polymer can easily achieve flatness of at least 90%, namely, almost perfect flatness provided that the polymer is in a liquid form. Where a polymer melts and flows under elevated pressure and a hot press has high surface flatness, application of a pressure by the hot press makes it possible to directly transfer the high flatness of the hot press. Such excellent flatness significantly contributes to the improvement of the productivity because the use of such a hot plate obviate mechanical smoothening. An ultra thin-film, interconnected, multilayer board is generally stacked on the upper side of a thick ceramic substrate. Its heating and cooling times depend, in many instances, on the magnitude of the heat capacity of the ceramic substrate rather than the baking time of the polymer. Even when a polymer is filled by pouring and casting it in a liquid form, the adoption of a hot plate which permits rapid heating and cooling is desirable for the improvement of the productivity.

When a solventless varnish or a polymer in a solventless form, said varnish or polymer being useful in the practice of the present invention, is cast or is caused to melt and flow, elimination of admixed air and/or a solvent, which may be contained in a small amount, under reduced pressure is effective for the complete prevention of occurrence of voids and/or pin-holes by such air and/or solvent. It is however necessary to press the resultant board under a hydrostatic pressure after application of such reduced pressure, because some voids and/or pinholes may still remain if the pressure is raised directly to normal pressure. The application of such a hydrostatic pressure can realize complete elimination of voids and pinholes.

Among the physical properties of a polyimide, the thermal expansion coefficient can be lowered to a level similar to that of a silicon substrate of an LSI (large-scale integrated circuit) if the thermal expansion coefficient alone is taken into account. Such a low thermal expansion coefficient however reduces the adhesion of the polyimide. Under the circumstances, the thermal expansion coefficient of the polyimide may hence be lowered only to the level of the thermal expansion coefficient ($18 \times 10^{-6} °C.^{-1}$) of copper. In the present invention, it is possible to bring the thermal expansion coefficient of the polymer into conformity with the thermal expansion coefficient desired for the interconnected multilayer board by mixing Aramid fibers having a negative thermal expansion coefficient or polyimide powder having a thermal expansion coefficient comparable with silicon and suitably adjusting the thermal expansion coefficient of the polymer. The addition of such polyimide powder can also bring about significant reinforcing effects since it features large extensibility. Although a polyimide releases water due to condensation in its curing reaction when it is used in the form of a varnish in which it is contained as a precursor, its curing reaction has already been completed when employed as polyimide powder. Polyimide powder therefore does not liberate any condensation-related water. Namely, the mixing of polyimide powder makes it possible to make the excellent physical properties of the polyimide contribute. Further, the polyimide does not pose any problem to dry etching because its etchability is substantially the same as that of a solventless polymer varnish. To the best knowledge of the present invention, polyimide powder having such numerous merits has not been used in thin-film, interconnected multilayer boards fabricated by stepwise thin-film technology.

As the poly(benzocyclobutene) polymer precursor, it is possible to use a benzocyclobutene monomer containing at least one benzocyclobutene ring per molecule, a mixture of such a benzocyclobutene monomer and its oligomer, or an oligomer of such a benzocyclobutene monomer, said benzocyclobutene monomer, mixture or oligomer being in a liquid form at temperatures not higher than 180° C. without addition of solvent and also in a liquid or flowable form at temperatures not higher than 280° C. under pressure without addition of solvent. As the poly(benzocyclobutene) polymer precursor, it is also possible to use a monomer mixture which is obtained by mixing a benzocyclobutene monomer with a comomer—said benzocyclobutene monomer having at least one benzocyclobutene skeleton per molecule and said comonomer having a rigid molecular structure and containing per molecule at least one moiety capable of forming dienophile. Either one or both of the monomer and comonomer may have been oligomerized either partially or completely, in other words, it is also possible to use a mixture of at least one of said monomer and comonomer and at least one of oligomers of said monomer and comonomer. The mixture should be in a liquid form at temperatures not higher than 180° C. without addition of solvent and also in a liquid or flowable form at temperatures not higher than 280° C. under pressure without addition of solvent, no matter whether either one or both of the monomer and comonomer have been oligomerized.

Usable examples of the benzocyclobutene monomer employed to form the poly(benzocyclobutene) polymer include compounds of chemical structures represented by the following formula (1):

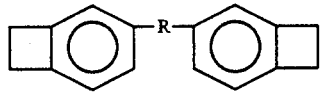
(1)

wherein R is represented by any one of the following formulae (i)–(iii):

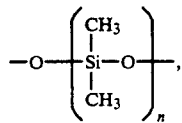
(i)

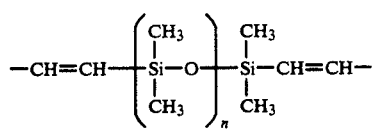
(ii)

wherein n is an integer of at least 1.

—A'$+$Ar—A$)_{\overline{m}}$Ar'—     (iii)

wherein Ar and Ar' are individually

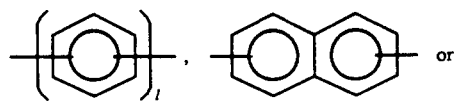

l being an integer of at least 0; and A and A' are individually a direct bond, —O—, —S—,

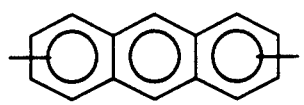

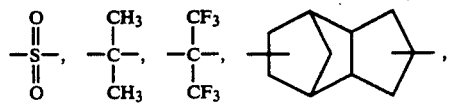

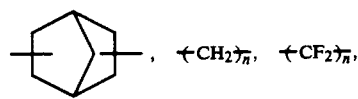

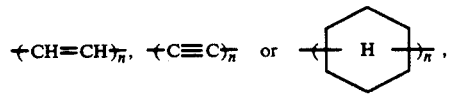

n being an integer of at least one, with the proviso that R is a direct bond when Ar and Ar' are each

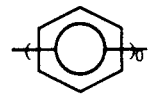

and A and A' are each a direct bond.

Specific exemplary benzocyclobutene monomers represented by the formula (1) include:

4,4'-Bisbenzocyclobutene     (1)

Bisbenzocyclobutenylethene     (2)

m-Bisbenzocyclobutenylethenylbenzene     (3)

p-Benzocyclobutenylbenzene     (4)
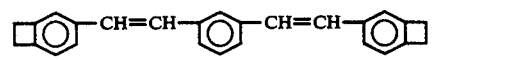

The above-described poly(benzocyclobutene) polymer precursor is in a liquid form at temperatures not higher than 180° C. without addition of solvent and also in a liquid or flowable form at temperatures not higher than 280° C. under pressure without addition of solvent. It can therefore be coated without any solvent, so that the resulting coating can be cured into a flat surface without development of substantial shrinkable formation of internal voids or pinholes by heating and curing treatment. Further, adjustment of its viscosity at the time of coating makes it possible to obtain a desired film thickness by a single coating operation.

Each insulating layer formed of the above poly(benzocyclobutene) polymer exhibits a thermal expansion coefficient of a level similar to or lower than the thermal expansion coefficient of the conductor layer made of copper or aluminum, whereby no substantial residual mechanical stress is produced in the conductor layers by the heating and curing treatment. In addition, the poly(benzocyclobutene) polymer has strong alkali resistance so that its quality is not modified by the plating of the conductor layers.

Figure 14:
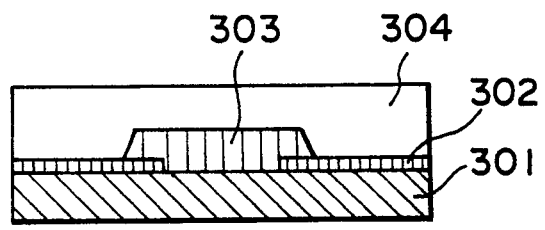
FIG. 14 is a cross-sectional view of a silicon substrate with a film of a poly(benzocyclobutene) polymer formed thereon.

FIG. 14 is a cross-sectional view of a semiconductor chip in which an insulating film 304 according to the present invention, said insulating film being made of a poly(benzocyclobutene) polymer, is provided on a silicon substrate 301 having an aluminum conductor film 303. Designated at numeral 302 is a silicon dioxide film.

Although FIG. 14 illustrates a simple cross-sectional structure to clearly show the principle and effects of the present invention, the present invention can be applied similarly to chips subjected to multilayer metallization and having a complex cross-sectional structure, such as memory devices. In the present invention, a powdery or particulate polymer precursor which may be a monomer or oligomer or a monomer-oligomer mixture is directly heated at a relatively low temperature, for example, around 150° C. and the melt is coated on a surface of the silicon substrate 301 by a coating method, for example, by spin coating. As a alternative, the powdery or particulate polymer precursor is spread directly over the surface of the silicon substrate 301 and is then heated and melted to coat the surface the resulting polymer.

Next, the temperature is raised, for example, to 250°-300° C. so that the melt is heated and cured.

Since the molten polymer precursor does not contain any solvent unlike the conventional polyamic acid solution, no shrinkage takes place when heated and cured. Further, the polymer precursor can be converted to a low-viscosity melt before it curing takes place. As a result, the heated and cured insulating film 304 can be formed with a flat surface.

Further, neither solvent not water which may otherwise be formed upon curing is evaporated, thereby making it possible to prevent formation of voids or in holes in the insulating film.

Furthermore, the viscosity of the oligomerized insulating material can be suitably controlled by suitably modifying the heating temperature, the heating time and/or the like so that a desired film thickness can be obtained by a single coating operation.

In addition, the insulating material according to the present invention has a thermal expansion coefficient substantially the same as or lower than that of the metal conductor layers to be covered with the insulating material. No substantial residual thermal stress is therefore left between each insulating film and its associated conductor lines by the heat treatment cycle upon fabrication of the conductor structure. Owing to this, there are practically no separation between the insulating films and their associated conductor lines, no deformation of the conductor lines and no disconnection of the conductor lines.

A description will hereinafter be made of insulating materials usable in the present invention and their treatment conditions.

In the present invention, poly(benzocyclobutene) polymers having a low thermal expansion coefficient of a level similar to or lower than that of a metal for metal conductor films, such as aluminum or copper, are used as insulating materials.

One type of such poly(benzocyclobutene) polymers can each be formed by heating and curing one or more monomers, which contain at least one benzocyclobutene skeleton per molecule, or one or more oligomers thereof, said monomers and oligomers being in a liquid form at temperatures not higher than 180° C.

Another type of such poly(benzocyclobutene) polymers are (benzocyclobutene-dienophile) copolymers, each of which can be prepared from an oligomer mixture which has in turn been formed from a monomer mixture prepared by mixing one or more benzocyclobutene monomers having at least one benzocyclobutene skeleton per molecule with one or more comonomers having a rigid molecular structure and containing at least one moiety capable of forming dienophile at a molar ratio in the range of from 0.1 to 99.9, said oligomer mixture being in a liquid form at temperature not higher than 180° C.

As monomers for the production of the poly(benzocyclobutene) polymers, the compounds of the chemical formula (1) can be used.

On the other hand, the solventless varnish is a composition of one or more of the bis(benzocyclobutenes) represented by the chemical formula (1).

When no low thermal expansion coefficient is exhibited by the use of a single poly(benzocyclobutene) polymer in a solventless form, it is necessary to use a solventless varnish which has been obtained by dissolving a comonomer, said comonomer having a rigid molecular structure containing per molecule at least one moiety capable of forming dienophile, in a monomer which can form the poly(benzocyclobutene) polymer and is in a liquid form at temperatures not higher than 180° C.

Such a copolymer may also be in the form of a solventless varnish which is obtained by dissolving a monomer, said monomer being capable of forming only the above poly(benzocyclobutene) polymer usable to exhibit any low thermal expansion coefficient when used singly and being in a solid form at temperatures not higher than 180° C., in a comonomer which has a rigid molecular structure containing per molecule at least one moiety capable of forming dienophile and is in a liquid form at temperatures not higher than 180° C. In addition, the copolymer may also be such that can be obtained from a monomer, said monomer being by itself capable of yielding a poly(benzocyclobutene) polymer of a low thermal expansion coefficient, and a comonomer having the above-described rigid molecular structure.

Insulating films formed using a comonomer of such a rigid structure have excellent heat resistance and, at the same time, superb flexibility, so that they exhibit improved mechanical strength.

The above-described dienophile comonomer may preferably have a molecular structure as represented by the following formula (2):

 (2)

wherein X is a direct bond,

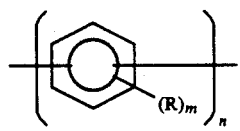

(m being an integer of 1–4, n an integer of at least 1, and R a hydrogen atom or an alkyl or aryl group), or

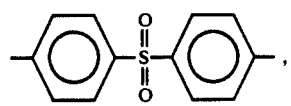

and Y and Y' are individually —C≡N,

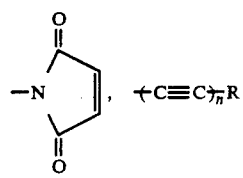, ₊C≡C₎ₙR (n being an integer of at least 1 and R hydrogen atom or an alkyl or aryl group), or

₊CH=CH₎ₙR (n being an integer of at least 1 and R a hydrogen atom or an alkyl or aryl group).

Among these, the following compounds are particularly preferred.

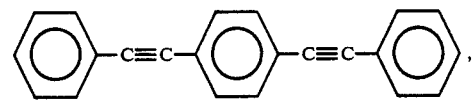

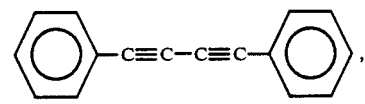

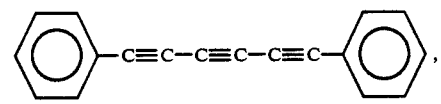

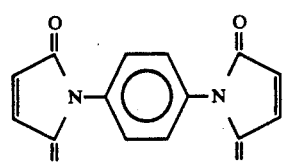

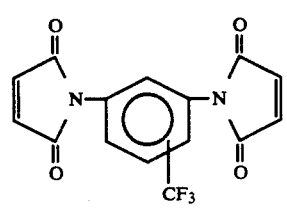

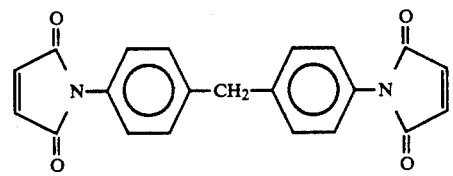

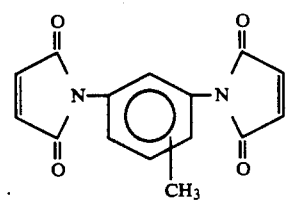

the improved flexibility appears to be brought about for the following reasons. Upon reaction of a bis(benzocyclobutene) with such a bis(dienophile) under heat, each of these reactants undergoes homopolymerization, namely, a crosslinking reaction. In addition, o-quinodimethane which had been formed by isomerization of benzocyclobutene undergoes a Diels-Alder reaction with the dienophile moiety to form a copolymer component of the linear molecular structure represented by the formula (3). The copolymer component is therefore mixed in the cured film, whereby the crosslinking density is lowered while maintaining the heat resistance.

(3)

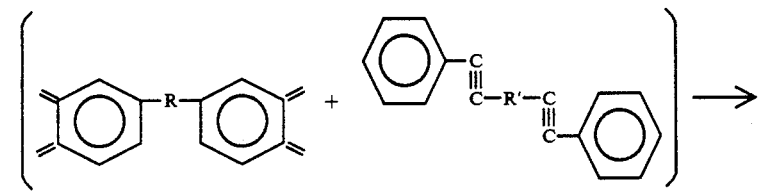

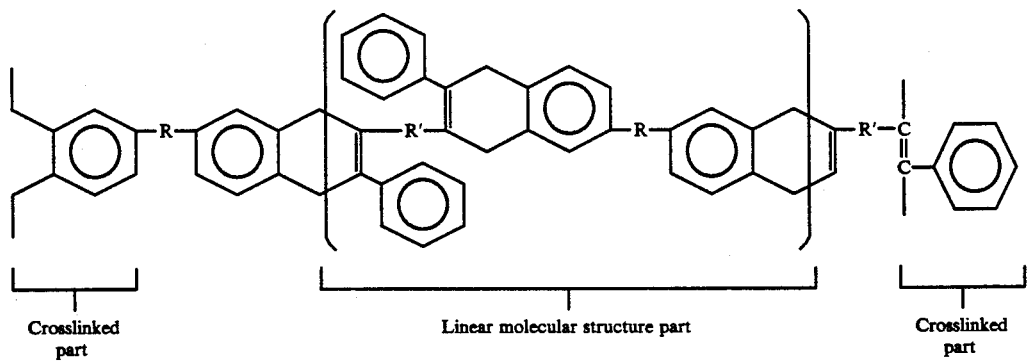

Crosslinked part | Linear molecular structure part | Crosslinked part

The present invention makes use of a solventless varnish prepared by dissolving one or more bis(dienophiles) in the above liquid bis(benzocyclobutene).

Further, the solventless varnish may be heated for a predetermine period of time so that it can be used as a solventless varnish of oligomers having a melting point not higher than 180° C.

An epoxy resin can be cured under elevated and/or reduced pressure because the epoxy resin does not by produce water upon polymerization, said water being a cause for foaming, and can be coated in a solventless state. In particular, amine-curable epoxy resins can be cured at a low temperature in a short period of time. For example, curing of an epoxy resin having naphthalene nuclei with diaminophenylmethane can be brought to completion in several minutes to 2 hours at 170°-200° C. Even taking this curing time alone, a significant improvement has been brought about in productivity over the curing of conventional polyimide resins as the latter curing requires several hours in total, including the period for gradual heating from a low temperature to a high temperature and the period for final heating at 350° 400° C.

Namely, the space between each two adjacent conductors is filled with a heat-resistant epoxy resin composition, which contains a heat-resistant epoxy resin and its curing agent, and the composition is then cured, whereby an insulating layer is formed between the two conductors.

Exemplary heat-resistant epoxy resins usable in the present invention include those having the chemical structure represented by the following formula (4). Such epoxy resins may desirably be formed of at least one type of nuclei selected from naphthalene nuclei, biphenyl nuclei and terphenyl nuclei.

 (4)

wherein R and R' are either the same or different and are independently selected from

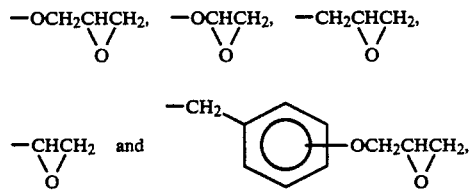

m and n are individually an integer of 1-2, and Ar stands for an aryl group whose examples will be described below. R and R' are bonded to terminal aromatic nuclei of the aryl group, respectively. It is to be noted that the bonding of a phenyl group to another phenyl group in the aryl group or the bonding of an —O— or —CH$_2$— group to a phenyl group in the aryl group is not limited to the p-position but may take place at the m-position or o-position or at a combination of two or more of the p-, m- and o-positions.

Regarding the bonding between R and R' and their associated terminal aromatic nuclei of the aryl group, it is to be noted that R and R' can be bonded to any positions of the associated terminal aromatic nuclei if possible.

Ar:

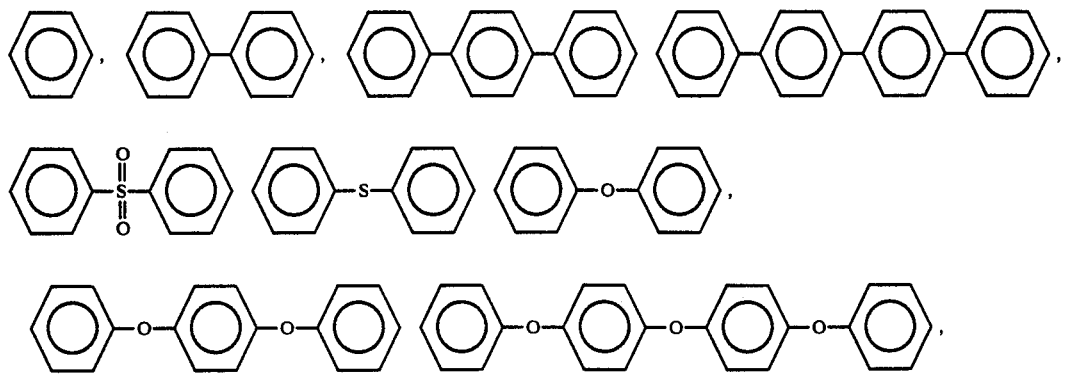

-continued
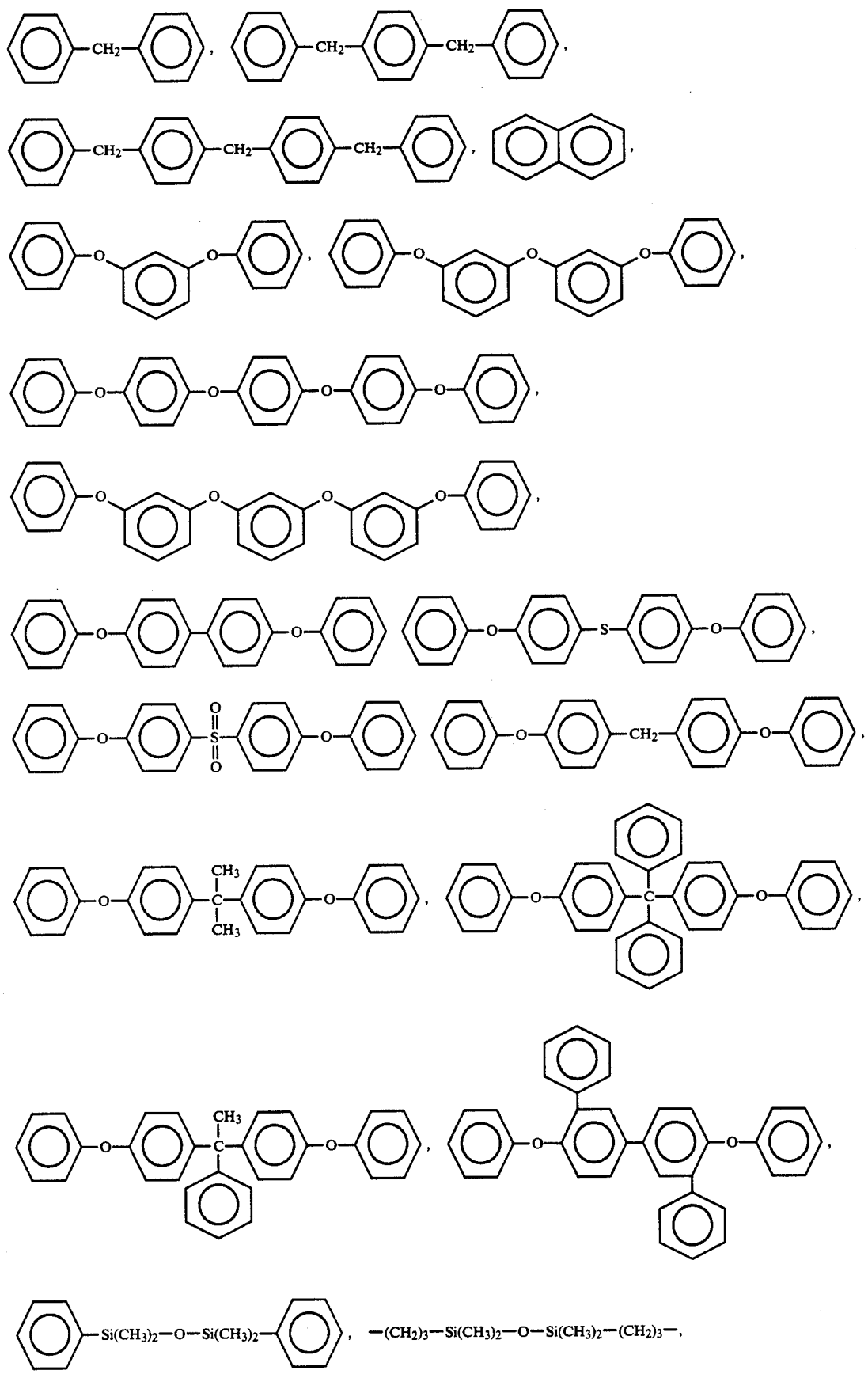

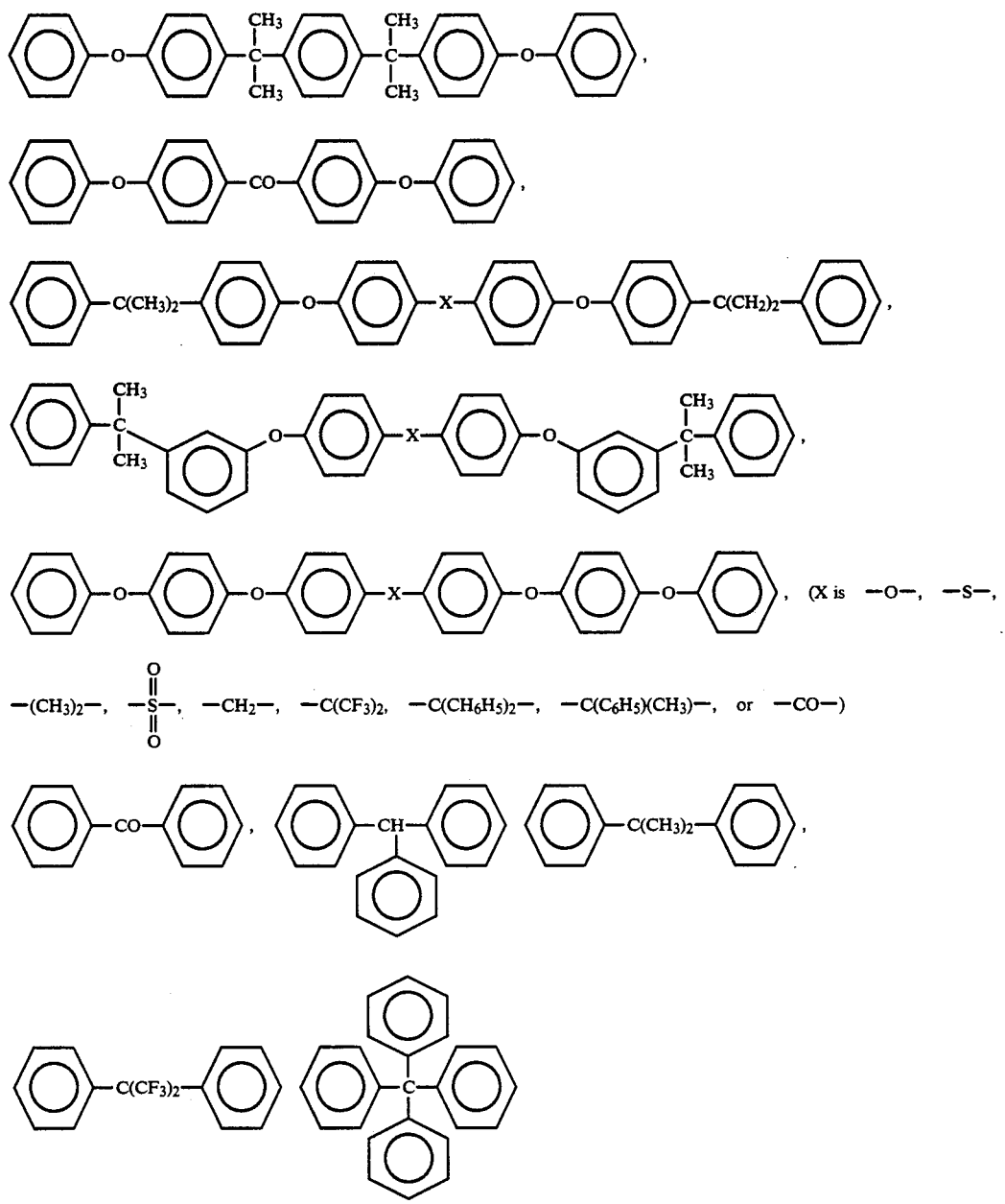

The aromatic diamine as a curing agent may desirably contain at least one of diphenylmethane, naphthalene, biphenyl and terphenyl nuclei, including, for example, 4,4'-diaminodiphenylmethane, 4,4'-diaminobiphenyl, 4,4''-diamino-p-terphenyl, 4,4'''-diamino-p-quaterphenyl, 1,6-diaminophthalene, and 9,10-diaminoanthracene. Illustrative of the aromatic diamine may include derivatives of compounds which contain one or more of the chemical structures represented by the formula (5);

$$H_2N-Ar-NH_2 \qquad (5)$$

Ar:

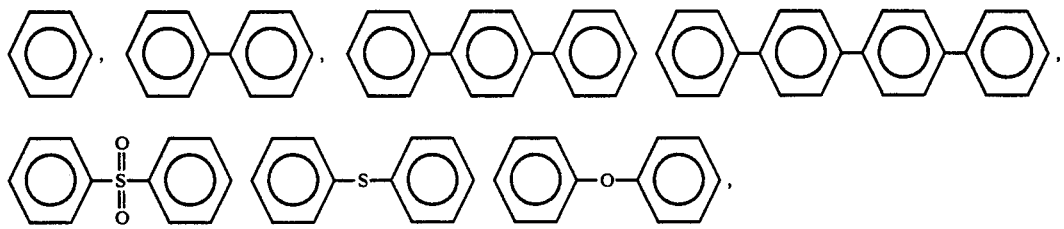

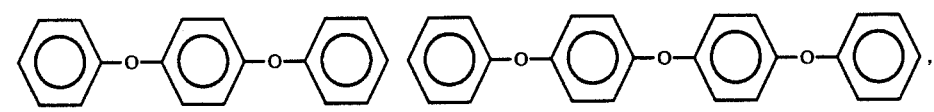
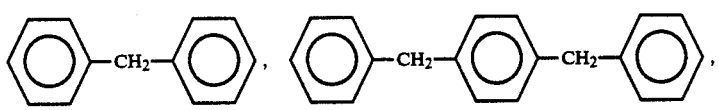
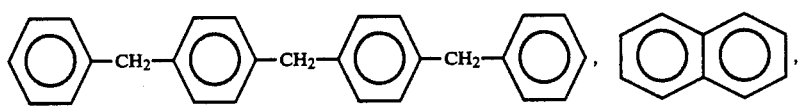
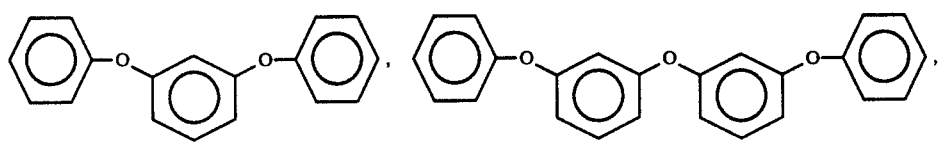
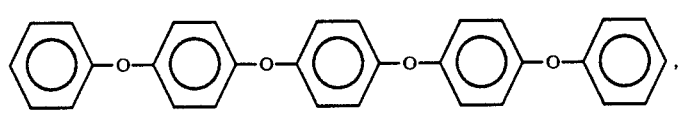
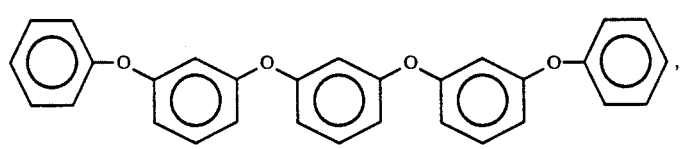
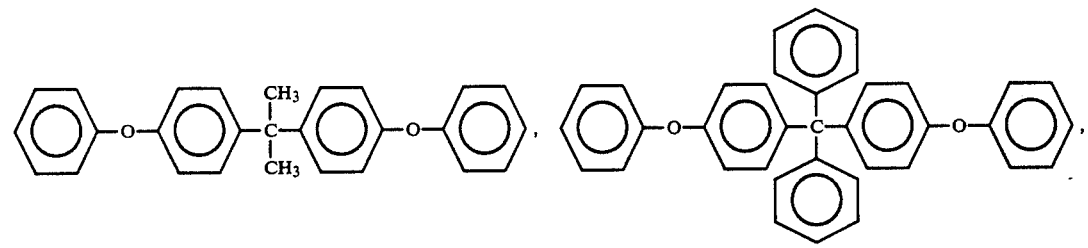
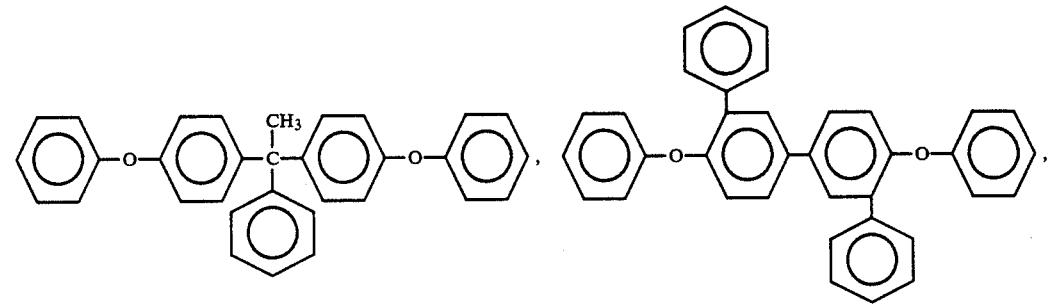

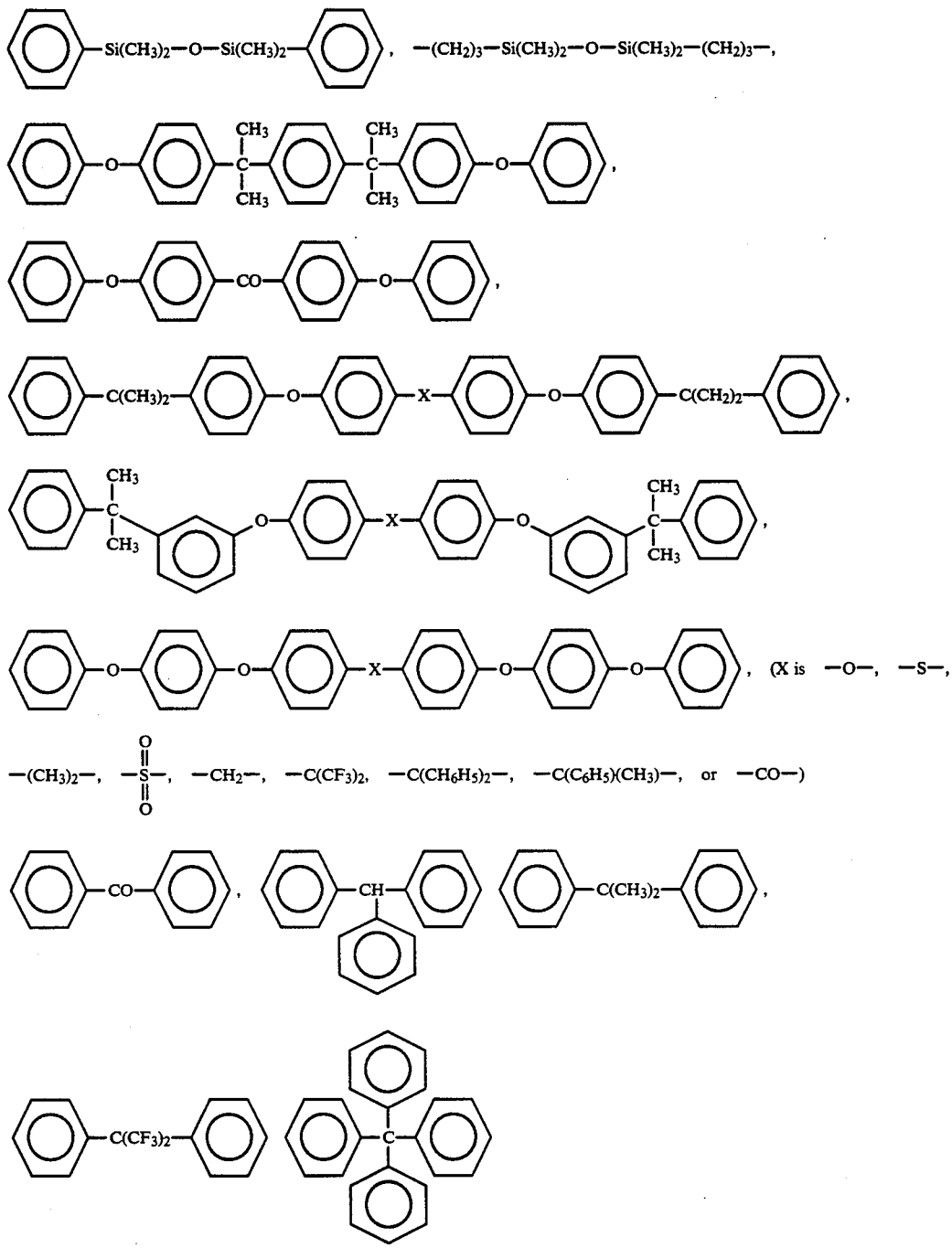

As the insulating material filled in the space between each two adjacent conductors, it is possible to use one or more of the above-described poly(benzocyclobutene) polymers and one or more of the epoxy resins in combination.

The use of such a poly(benzocyclobutene) polymer or heat-resistant epoxy resin in place of the conventional polyimides can significantly reduce the curing time. Substantial heating and cooling times are however required where the base substate of a interconnected multilayer board is a ceramic substrate. Since the baking time has to be determined by taking into consideration not only the curing time for the insulating material but also the time required for the baking of the ceramic substrate, the actual baking time therefore becomes quite long.

With a view toward shortening the time required for heating and cooling the ceramic substrate, the present invention makes use of a hot plate, which can be heated, to cure the poly(benzocyclobutene) polymer precursor or epoxy resin composition by taking a hint from the fact that the above resin material can be sufficiently melted and cured on the hot plate. One example of this process is illustrated in FIG. 16. As is illustrated in FIG. 16(a), a poly(benzocyclobutene) polymer precursor or epoxy resin composition, which may hereinafter be called a "resin material" for the sake of brevity, 402 is coated on a hot plate 401 which can be heated. When coating is conducted using a solvent, the solvent is caused to evaporate to bring the coating into a solventless state. Reference is next made to FIG. 16(b), in which the resin material side of the hot plate is superposed on conductors 404 on a substrate 403 and is pressed against the conductors 404. The hot plate is then heated to cause the resin material 402 to melt, whereby the thus-molten resin material is allowed to move into spaces 405. As a result, as is depicted in FIG. 16(c), the resin material 402 between the hot plate and the top surfaces of the conductors flows into the spaces 405 between the conductors so that substantially no resin material remains between the hot plate and the top surfaces of the conductors. Removal of air from spaces between the conductors under reduced pressure and subsequent heating under hydrostatic pressure make it possible to prevent occurrence of voids and pinholes which tend to result in short circuiting and/or open (i.e., circuit interruption). This therefore contributes to the improvement of reliability. If the surface of the hot plate is formed flat very accurately, the upper surface of an interconnected conductor lines which are to be obtained after curing also becomes flat. In this manner, it is possible to impart high-accuracy flatness of ±0.5 μm or narrower. An epoxy resin composition, for example, begins to melt from about 80° C. and can be fully cured in 2 hours at 170° C. The epoxy resin composition can therefore be fully cured in several minutes when it is cured while raising the temperature from 170° C. to 200° c. Although the hot late can be heated rapidly, it is difficult to conduct rapid heating when the ceramic substrate is heated in an oven. The curing method making use of a hot plate—which includes heating, depresurization, pressurization, melting and flowing, and flattening—has brought about a considerable contribution to the shortening of the fabrication time.

Figure 17A:
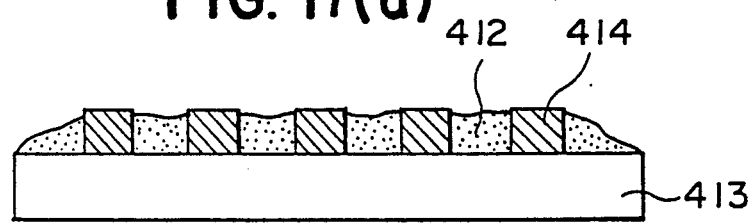
FIGS. 17(a) and 17(b) depict a flow chart of a process for filling spaces between adjacent conductors with a resin material, such as a poly(benzocyclobutene) polymer or a heat-resistant epoxy resin, by using a hot plate.
Figure 17B:
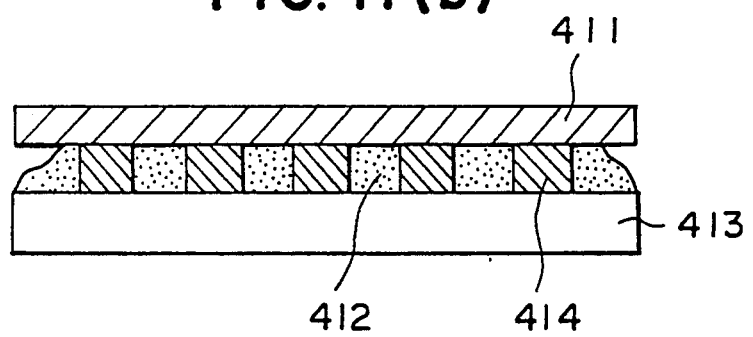

As an alternative method, after spaces between individual conductor lines 414 on a substrate 413 are filled with a resin material 412 in advance as shown in FIG. 17(a), a hot plate 411 is placed on the resin material to cure the same.

No epoxy resin composition having a glass translation point of 200° C. or higher has heretofore been known. In the present invention, novel epoxy resin compositions having a glass transition point of at least 250° C., desirably 300° C. or higher and low thermal expansion property have been found for the first time. Further improvements have also been made to these compositions in the present invention so that they have become usable for interconnected, thin-film, multilayer board. For example, a resin material which is obtained by curing a naphthalene-ring-containing epoxy resin with diaminodiphenylmethane has been found to have a glass transition point as high as 300° C. or even higher. This high glass transition point makes it possible to use a higher temperature when assembling is conducted by soldering, leading to the advantage that the hierarchy of layers to be connected by soldering can be increased to significant extent. This advantage derived from the high glass transition temperature therefore has extremely important significance for the assembly of modules to be employed in a complex, multilevel computers.

The cured product of the epoxy resin composition has lower elongation compared to the polyimide. This may be come a potential problem in the fabrication process for interconnected multilayer boards which are subjected to large thermal stress by heating and cooling. Although the epoxy resin composition itself has good adhesion and excellent mechanical properties, its reliability must be enhanced further when it is used as a composite material in combination with a material having a low thermal expansion coefficient like copper or ceramics. One solution for this potential problem is to use a fibrous material or polyimide powder as a filler. Usable examples of the fibrous material include aramid fibers which have high tensile and high modulus and negative expansion coefficients for both heat and moisture and contain ionic substances at an extremely low level, for example, "TEKNOLA" (trade mark; product of Teijin Limited). The low content of ionic substances is favorable from the standpoint of coping with the potential problems that migration of copper may take place at high conductor line densities and electrodes of semiconductor chips may be subjected to erosion when the chips ar mounted directly. Another solution is to use, as a filler, organic powder having high tension, high elongation and expansion, especially polyimide powder. Examples of polyimide powder include those having a chemical structure represented by the following formula (6):

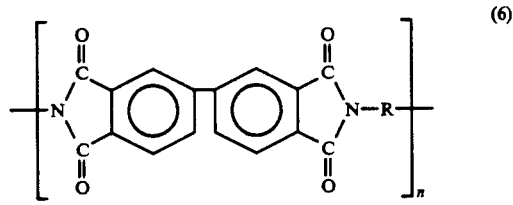

(6)

In the above formula (6), the polyimide is poly(N,N'-oxydiphenylenebiphenyl tetracarboxylimide) when R is

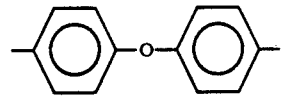

and poly (N,N'-p-phenylenebiphenyl tetracarboxylimide) when R stands for

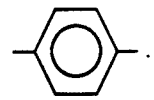

Commercial products ("UIP-R" and "UIP-S", both trade names; products of UBE INDUSTRIES, LTD.) are usable.

By one or more of these reinforcement materials, the insufficient elongation of the cured product of the heat-resistant epoxy resin composition is sufficiently compensated. The addition of such a reinforcement material is of course effective for the poly(benzocyclobutene) polymer described above.

The reinforcement by such a reinforcement material can be conducted by filling the reinforcement material in spaces between conductor lines, filling the spaces with the poly(benzocyclobutene) polymer precursor or heat-resistant epoxy resin composition and then curing the precursor or composition or by filling the spaces with the poly(benzocyclobutene) polymer precursor or heat-resistant epoxy resin composition, in which the reinforcement material has been added, and then curing the precursor or composition.

To prevent adhesion of the resin material, i.e., the poly(benzocyclobutene) polymer precursor or heat-resistant epoxy resin composition tot he upper faces of conductors, it is effective to treat only the upper faces of the conductors with a fluorine-containing surfactant or a fluorine-containing polymer. This treatment can shorten the time required for dry processing, which is conducted after the filling of the interconductor spaces with the resin material to clean the upper faces of the conductors, and can also facilitate the dry processing. If the resin adhered to a large thickness on the upper faces of the conductors, it would be necessary to make longer the dry etching time which is required to remove the resin. It is however, possible to reduce the etching time as short as the time required for the removal of such a fluorine-containing material only, provided that substantially no resin is adhered. In the process for the formation of an upper conductor layer than the above-mentioned conductor layer to fabricate an interconnected multilayer board, the upper faces of the conductors in the lower conductor layer are connected to the conductors in the upper conductor layer so that the conductive metal of the former conductors must be exposed and also clean.

As has been described above, synergistic effects are achieved among the individual advantages which can be brought about by (i) using the resin material—said resin material being capable of satisfying various requirements such that water is not by produced upon curing unlike conventional polyimides, curing quickly proceeds at low temperatures, the surface of conductors can be easily smoothened and high glass transition point and low thermal expansion property are exhibited, (ii) heating and melting the solventless resin and hence making the resin flowable by the use of a hot plate permitting rapid heating and cooling, (iii) adding aramid fibers having a negative thermal expansion coefficient to heat and moisture or polyimide powder having high tension, high elongation and low thermal expansion coefficient, (iv) treating conductor surfaces with the fluorine-containing material, and (v) depressurization and pressurization upon curing. These synergistic effects can make it possible to realize high throughput and short lead time in the fabrication of interconnected multilayer boards, leading to the achievement of superb mass productivity. The foregoing features are also effective for the prevention of pinholes and voids which are observed when a polyimide is used, thereby avoiding electrical deficiencies such as short circuiting and open (circuit interruption) and hence improving the reliability and fabrication yield. Although no polyimide varnish can fill up voids of 30 μm and smaller in a substrate, the poly(benzocyclobutene) polymer or solventless epoxy resin can easily fill then up under reduced pressure. As a result, it is possible to avoid the occurrence of pinholes and voids in insulating layers. With a view toward preventing the formation of such pinholes and voids, efforts have heretofore been concentrated on the very difficult goal to provide void less ceramic substrates. The present invention however does not require such efforts, whereby substantial advantages have been brought about over the conventional processes.

Compared with the conventional pedestal process for the stepwise fabrication of an interconnected multilayer board in which process an under-conductor-layer-forming metallic material, a plating resistant and a plating material are used and the removal of the resist, the removal of metallic under-coat layers and the coating and grinding of the insulating polymer are performed layer by layer, the process of the present invention features the simultaneous removal of the resist, the simultaneous removal of the metallic under-coat layers and the subsequent simultaneous casting and treatment of an insulating varnish or simultaneous coating with an insulating material or a combination of both the treatments. As a result, the number of steps has been decreased substantially including the omission of the grinding and polishing step of the insulating polymer, so that process simplification has been achieved. The advantages of the present invention are not limited to the foregoing. Defective voids can be reduced owing to the use of the solventless varnish, and the omission of the dust-particle-producing step has made it possible to minimize the occurrence of short-circuiting by dust particles and open (circuit interruption), thereby bringing about a considerable contribution to the improvement of the fabrication yield and also to the stabilization of the service life of the conductor lines.

In addition, the solventless heat-resistant varnish permits easy smoothening of each base substrate.

Further, a skeleton structure of interconnected conductor lines are formed in the course of the fabrication process. In that stage, the conductor lines are exposed so that their washing with water can be easily enhanced and no plating solution is hence allowed to remain.

Furthermore, functional material or materials can be freely incorporated not only on the base substrate but also on or adjacent the surface of the interconnected multilayer board or in intermediate part or parts of the interconnected multilayer board. In particular, top and bottom substrates can be simultaneously bonded and fixed by filling a solventless varnish. This permits off-line production of top or intermediate substrate or substrates, thereby brining about extremely significant effects for the decrease of the process steps and also for the improvements of the fabrication yield. Further, compared with the external provision of functional devices such as capacitors and resistors, their built-in arrangement can substantially contribute to improvements of the packaging density and, hence, of the signal propagation velocity.

Although the individual features of the present invention are of course important, it is to be noted that, as has been described above, these features have been combined together as a system while ingeniously bring them into conformity with the combination so attained, namely, the multilayer metallization process. The present invention is absolutely different from the conventional processes especially in that, in ultramultilayer metallization, each layer can be completed with the yield of 100%. It has heretofore been difficult to bring each of the features into conformity with the overall combination or system. The present invention has ingeniously overcome this difficulty.

The present invention will hereinafter be described in further detail by the following examples. It is however borne in mind that the present invention is not necessarily limited to or by the following examples.

EXAMPLE 1

An interconnected multilayer board was fabricated in accordance with the process shown in FIGS. 1(a) to 1(h). As is illustrated in FIG. 1(a), a metallic under-conductor layer 2 formed of sputtered, overlaid, thin films of Cr/Cu/Cr and having a thickness of 0.15-0.8 μm was formed on a base substrate 1. After a window was formed through a photoresist, Cr was removed by etching at a position located right below a position where a via-hole conductor was to be formed, whereby the copper was exposed. Reference is next made to FIG. 1(b). As a thick-film resist 3 (thickness: 22 μm), for example, a positive resist of the phenolic novolak type was spincoated and a solvent was caused to evaporate to dry the resist. The resist was exposed through a mask to radiation, developed and then fixed, so that windows were formed in accordance with a desired via-hole arrangement pattern. Next, as is illustrated in FIG. 1(c), electroplating was selectively conducted on the copper of the metallic under-conductor layer, said copper having been exposed in the bottom of a window 4, by using an aqueous solution of copper sulfate, whereby a copper conductor 5 having substantially the same height as the thick-film resist 3 was formed as a via-hole conductor.

The steps described above include the step in which a via-hole layer is formed. When a conductor layer is desired, the above process can also be followed similarly except that a different pattern is used.

Taking the above steps from the formation of the metallic under-conductor layer to the electroplating of copper as 1 cycle, the cycle was then repeated so that via-hole conductors and line conductors were alternated. As a result, a multilayer structure of n=30, namely, 30 layers was formed in the stage shown in FIG. 1(d).

A sputtered net-like film of Cu/Cr/Ni was next provided as a support layer 13 on the surface of a via-hole layer 12 which was the uppermost layer. Further, a fixing plate 14 made of a 0.5-mm thick Ni plate was soldered for reinforcement purpose.

Thereafter, the thick-film resist films were simultaneously removed with a solvent while using, for example, an aqueous solution of sodium carbonate, tetraethylammonium hydroxide, sodium hydroxide or potassium hydroxide. Further, the sputtered, metallic undercoat Cr/Cu/Cr layers were simultaneously etched off using, for example, ammonium cerium(IV) nitrate or the like. As a result, 30-level copper conductor lines of a skeleton structure were formed in the state shown in FIG. 1(f).

After the skeletal copper conductor lines were thoroughly washed with purified water, the copper conductor lines were dried to eliminate water. The skeletal copper conductor lines were placed in a box-like container made of an RTV rubber. In a vacuum, a heat-resistant, solventless varnish 16 containing cyclobutene rings [trans-1,2-bis(benzocyclobutenylethene), melting point: 132° C.] was heated and injected into the container and was cured at temperatures exceeding 250° C. at the end, so that a voidless module board having a low dielectric constant ($\epsilon$=2.6) was obtained. The solder was thereafter heated and removed to take off the uppermost fixing Ni plate 14.

EXAMPLE 2

Skeletal conductor lines of copper were formed in a similar manner to Example 1, followed by their placement in a box-like container made of an RTV rubber. The skeletal conductor lines of copper were then impregnated with a solvent-based fluorine varnish, for example, an emulsion-type PTFE, PFA, FEP or the like, whereby a coating of 3 μm thick was formed on the surface of each conductor line of copper. In a vacuum, the same heat-resistant, solventless varnish having cyclobutene, said varnish being of the same one as that employed in Example 1, was heated and injected so that the varnish was poured. The varnish was then subjected to curing at temperatures exceeding 250° C. at the end, thereby obtaining a voidless module board whose dielectric constant was reduced further ($\epsilon$=2.4).

EXAMPLE 3

Skeletal conductor lines of copper were formed in a similar manner to Example 1. To prevent slackening of the copper conductor lines, insulating spacers 33 were inserted to fix the positions of the conductor lines as illustrated in FIG. 3(d). The skeletal copper conductor lines with the insulating spacers 33 provided therein were then placed in a box-like container made of an RTV rubber. The skeletal copper conductor lines were then impregnated with a polyimide varnish to form an enamel coating of 3 μm thick on the copper lines, whereby a module board was obtained without filling the container made of an RTV rubber with a solventless varnish.

Incidentally, the spacers 33 were formed, as shown in FIG. 3(a), layer by layer as needed by a photolithographic technique. It is to be noted that spacers 33 formed separately can be inserted physically in spaces formed by the removal of the resist.

EXAMPLE 4

The fabrication process of Example 1 was followed except that, instead of separately forming windows in the metallic under-conductor layers and the photoresist layers, self-bonding or adhesive tapes windowed in the patterns of through-hole conductors or line conductors and carrying metallic under-conductor layers, respectively, were used.

The formation of windows in each of the films can be conducted, for example, by exposing a photosensitive, heat-resistant polymer such as a photosensitive polyimide to radiation and developing the same or by laser exposure or dry etching of a photoinsensitive heat-resistant polymer while using the metallic under-conductor layer as a tank. The formation of the polymer films with metallic under-conductor layers formed thereon, respectively, can be conducted off-line separately. The time required for the formation of these polymer films in the multilayer metallization can be omitted.

On a base substrate on which a metallic under-conductor layer of Cr/Cu/Cr had been formed in advance by vacuum deposition, sputtering, ion beam sputtering or the like, the corresponding polymer film was bonded with the positions of connecting terminals of the base substrate being aligned with the positions of via-holes in the polymer films. Cr portions, which were visible in the bottom of via-holes respectively, were etched off to expose Cu portions. Electroplating of copper was then conducted on the thus-exposed Cu portions to fill up the via-holes with Cu, whereby a via-hole conductor layer was formed.

Following the formation method of the above via-hole conductor layer, a conductor layer was then formed. These steps then alternately repeated, thereby fabricating an interconnected multilayer board which contained metallic under-conductor layers and polymer film layers.

Thereafter, the polymer film layers were first dissolved off and the metallic under-conductor layers were then etched off, whereby multilevel conductor lines of a skeleton structure were fabricated.

Next, in a manner similar to Example 1, the space in the skeleton was filled with a heat-resistant, solventless varnish which was composed of bisbenzocyclobutene (in an oil form), so that a voidless module board was obtained.

EXAMPLE 5

Figure 6A:
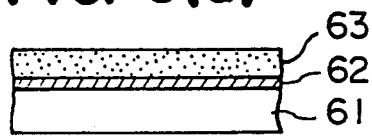
FIGS. 6(a) through 6(j) depict a flow chart of a process according to a still further embodiment of the present invention, which is suitable for use in the fabrication of an interconnected multilayer board having spacers.
Figure 6B:
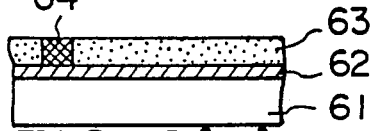
Figure 6C:
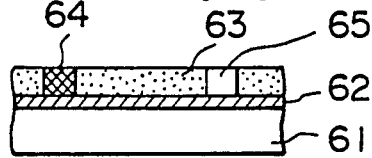
Figure 6D:
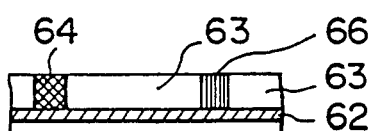

By the process depicted in FIGS. 6(a) through 6(j), multilayer conductor lines of a skeleton structure having a skeleton structure were formed. As is shown in FIG. 6(a), a metallic under-conductor layer 62 composed of sputtered, overlaid thin films of Cr/Cu/Cr were formed on a base substrate 61. A photosensitive polyimide 63 was spincoated as a first polymer layer on the metallic under-conductor layer 62. As is illustrated in FIG. 6(b), the polyimide portion corresponding to the spacer 64 was only exposed to radiation. Next, as is shown in FIG. 6(c), a window 65 for the formation of a via-hole was formed by a linear beam. The window 65 was filled with copper so that a via-hole conductor 66 was formed as illustrated in FIG. 6(d).

Figure 6E:
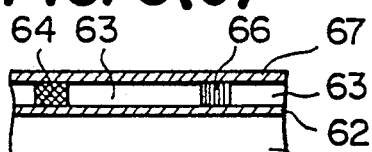
Figure 6F:
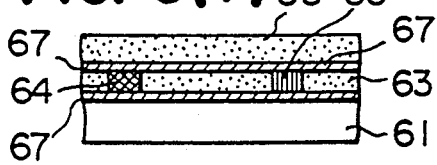
Figure 6G:
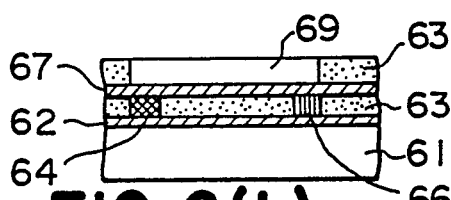
Figure 6H:
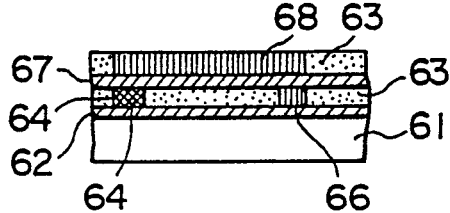

Reference is next made to FIG. 6(e), in which the next layer, namely, a metallic under-conductor layer 67 was formed. As is shown in FIG. 6(f), a photosensitive polyimide 63 was coated as a second polymer layer. A window 69 was then formed in an X-layer by a laser beam. Next, as is shown in FIG. 6(h), the window 69 was filled with copper to form an X-layer conductor 68.

Figure 6I:
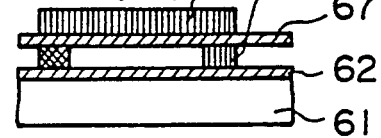
Figure 6J:
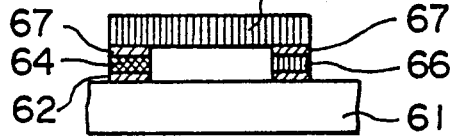

Thereafter, as is depicted in FIG. 6(i), the photosensitive polyimide was removed with a solvent. Next, as is shown in FIG. 6(j), the metallic under-conductor layers were etched off to form 2-layer conductor lines of a skeleton structure.

Following the procedure of Example 1, the 2-layer conductor lines were placed in a box-like container and the box-like container was filled with a heat-resistant, solventless varnish of p-bis(benzocyclobutenyl)benzene (melting point: 170° C.). The above steps are repeated to fabricate a module board having an interconnected 10-layer structure.

EXAMPLE 6

A metallic under-conductor layer formed of sputtered, overlaid, thin films of Cr/Cu/Cr and having a thickness of 0.5 $\mu$m was formed as an electroplating electrode on an interconnected, multilayer, ceramic board. Cr portions located right underneath positions where via-hole electrodes were to be formed were next etched off to expose copper portions. A solvent-based, heat-resistant polyimide varnish was then spincoated. After the varnish was heated and the solvent was caused to evaporate to dry the varnish, an Al mask was formed by sputtering and photolithography. Windows were then formed by dry etching. On copper portions of the metallic under-conductor layer, said copper portions having been exposed in the bottoms of the respective windows, electroplating was selectively conducted using an aqueous copper sulfate so that copper was filled to substantially the same thickness as the solvent-based, heat-resistant polyimide.

Taking the above steps as 1 cycle, 30-layer metallization was conducted such that via-hole conductors and line conductors were alternated.

Finally, a sputtered, overlaid film of Cr/Cu/Cr/Ni was provided on the uppermost conductor layer. A heat-resistant, solventless varnish was coated to a thickness of 2-3 $\mu$m on the sputtered film. A 30$\mu$m thick ceramic plate defining a via-hole window and having a ring-shaped, think-film, CrSiO$_2$ resistor formed thereon was mounted over the varnish. The varnish was then bonded under heat to the ceramic plate so that the latter was fixed. The cured film portion of the heat-resistant, solventless varnish in the bottom of the via-hole was removed by dry etching. After a plating resist was applied, the window was filled with copper by electroplating. The upper plating resist was then removed, and an Al electrode was provided in such a way that the Al electrode can be connected to CrSiO$_2$ and Cu via the thin Cr barrier layer. Following the above process, a via-hole layer was thereafter provided above and terminals for mounting LSI's thereon were provided.

The resist layers and metallic under-conductor layers in the above 3-layer conductor lines were removed to form skeletal conductor lines. The spaces of the skeletal conductor lines were filled with the same heat-resistant solventless varnish as that used in Example 1, whereby a module board with functional elements built therein was obtained.

EXAMPLE 7

A metallic under-conductor layer made of Cr/Cu/Cr and having a thickness of 0.8 $\mu$m was provided on a base substrate. A photoresist was coated to a thickness of 25 $\mu$m over the metallic under-conductor layer. The photoresist was subjected to exposure through a mask and then to development, so that windows were formed in the pattern of conductor lines in an X layer. Cr portions in the bottoms of the windows were etched off. Copper was then filled in the windows by electroplating. As an electrode for the plating, the metallic layer under the conductor lines in the X layer was used as was. Namely, no metallic under-conductor layer was provided on the conductor lines in the X layer, and a photoresist was coated to a thickness of 25 $\mu$m over the conductor lines in the X layer. By exposure through a mask and subsequent development, windows extending to the pattern of conductor lines in a Y layer were formed in the form of via-holes. Those windows were filled with copper by electroplating. The photoresist layers were simultaneously removed with an organic solvent, followed by the simultaneous removal of the plating electrodes, i.e, the metallic under-conductor layers with an etchant. After the conductor lines of the skeleton structure were thoroughly washed, a solventless, heat-resistant varnish of cis-1,2-bis(benzocyclobutenyl)ethane (in an oil form) having cyclobutene rings was finally poured into the spaces in the skeleton structure under reduced pressure, whereby the spaces were filled with the varnish. The varnish was then cured. Since the varnish was excellent in flatness, substantially no ruggedness appeared on the interconnected multilayers board. The surface was subjected to dry etching to expose the via-hole conductors.

By the above procedures, the formation of the conductor lines in the first X layer and the via-holes was completed. The same procedures were thereafter repeated to successively form the conductor lines in the Y layer and via-holes as well as a gland layer and a via-hole layer, thereby achieving multilayer metallization. Further, this cycle was repeated twice so than an interconnected multilayer board having two sets of signal layers was fabricated.

EXAMPLE 8

Following the procedures of Example 7 and using metallic under-conductor layers and window-defining photoresist layers, multilayer metallization was conducted by electroplating to form via-holes→X conductor lines→via-holes→gland layer. The gland layer was in the form of a mesh and contained via-holes isolated from the glands with the polymer interposed therebetween. Then, a Cr/Cu/Cr layer was formed as a plating electrode to a thickness of 0.8 μm over the entire surface of the gland layer. A photoresist was then coated to a thickness of 25 μm over the entire surface of the plating electrode. The photoresist layer was exposed to radiation through a mask and then developed, whereby windows for conductor lines were formed in a form crossing above the via-hole conductors. By electroplating, the windows were filled with 25-μm thick copper. The conductor lines provided at the end were provided to fix the conductor lines, which were located under the via-holes, by the gland layer. They also serve to protect the upper ends of the via-hole conductors from contamination until they are subsequently etched off.

On the other hand, the gland layer was fixed at the periphery thereof by posts which were formed by electroplating and which extended from the underlying base substrate. The photoresist layers and metallic under-conductor layers were then removed successively or alternately with an organic solvent and an etchant. The resulting conductor lines of a skeleton structure were washed thoroughly. A cyclobutene compound, i.e., cis-1,2-bis(benzocyclobutenyl)ethene in the form of a solventless, heat-resistant varnish was injected into the spaces in the skeleton structure in a vacuum, whereby the spaces were filled with the varnish. The varnish was then cured. After completion of the above process, the fixing conductor lines on the glands were removed with an etchant to expose the via-hole conductors.

Taking the above steps as 1 cycle, they were repeated as needed to achieve multilayer metallization. It took only about 72 hours up to this stage although the conventional stepwise fabrication process for an interconnected multilayer board took 360 hours to the same stage.

With the solventless varnish of the cyclobutene type which was used in the above procedures, neither occurrence of water and/or gas as a reaction byproduct upon polymerization nor occurrence of voids due to remaining solvent was observed. In the case of a solvent-base varnish, it is necessary to repeatedly coat it many times in order to to from a thick layer as the solvent must be caused to evaporated after its coating. In the case of a solventless varnish, only one injection is needed no matter how the intended layer is thick.

Further, use of a solvent-based varnish does not permit simultaneous bonding of an upper substrate and a lower substrate. This is however possible when a solventless varnish is used. Further, in the case of the solventless varnish, it is also possible to simultaneously fill up defective surface voids in the base substrate. This means that the solventless varnish can completely avoid short-circuiting and open (circuit opening) due to through-pinholes in thin film portions and/or intralayer voids which are attributed to defective surface voids in a base substrate, said defective surface voids being observed in a board fabricated by stepwise multilayer metallization while using the solvent-based varnish.

EXAMPLE 9

Following the process of FIGS. 5(a) through 5(g), spacers were formed by the thin-film technology. A metallic under-conductor layer 52 formed of Cr/Cu/Cr and having a thickness of 0.8 μm was formed on a base substrate 51. Over the metallic under-conductor layer, a photosensitive polyimide 53 was coated to give a post-curing thickness of 20 μm. The photosensitive polyimide was exposed to radiation through a mask, developed and then subjected to post-curing, whereby columns 54 several μm greater than the diameter of via-holes were formed at positions where the via-holes were to be formed and, at the same time, spacers 55 supporting conductor lines in an X layer were also formed at positions not overlapping with the positions of the via-holes. At positions other than the spacers 55 and via-hole-forming columns 54, a Zn film was formed to a thickness of 20 μm by electroplating. A resist having resistance to dry etching was then coated on the Zn film. By exposure through a mask and subsequent development, a via-hole-forming mask was formed. Using this mask, the columns 54 formed in advance for the formation of via-holes were subjected to dry etching to form windows therein. The windows 58 thus formed were then filled with Cu 59 by electroplating.

A Cr/Cu/Cr layer was then provided as an upper layer and, thereafter, X-layer conductor lines were formed in accordance with the foregoing procedures. Thereafter, following the procedures of Examples 8, multilayer metallization was conducted in the order of via-hole→Y-layer conductor lines→via-holes→gland layer→fixing plate layer. The photoresist layers, metallic under-conductor layers and Zn films were removed by a solvent and an etchant, whereby conductor lines of a skeleton structure were formed. After the skeleton structure was filled with a solventless varnish or it was treated with a solvent-based varnish and then filled with a solventless varnish, the varnish was heated and cured to obtain a module board.

EXAMPLE 10

Figure 7A:
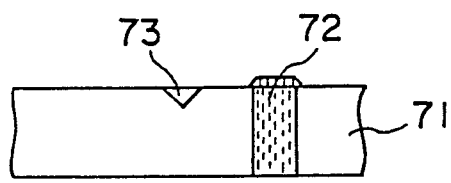
FIGS. 7(a) through 7(c) illustrate a flow chart of a process for making a base substrate flat in the fabrication of an interconnected multilayer board in accordance with the present invention.
Figure 7B:
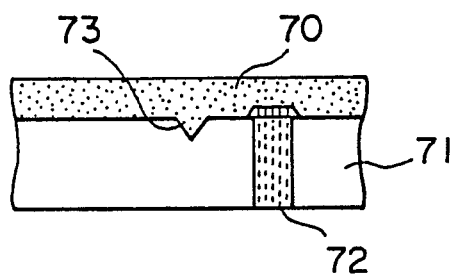
Figure 7C:
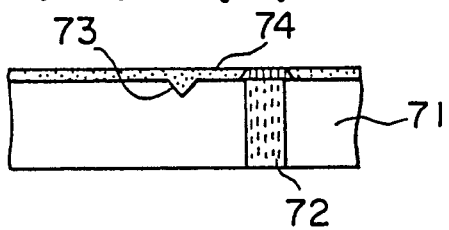

As is shown in FIG. 7(a), a terminal 72 of a base substrate 71 was flattened by tape grinding. To fill up a defective void 73 in the surface of the base substrate 71, a benzocyclobutene polymer 70, i.e., poly(bisbenzocyclobutene) (glass transition point: 300° C., thermal decomposition temperature: 400° C.) in a solventless form was spincoated to form a surface layer 74 as illustrated in FIG. 7(b). As is depicted in FIG. 7(c), by dry etching, the terminal 72 was exposed and a flat substrate surface layer 74 was formed. It is possible to eliminate nay defective surface voids by conducting the spincoating first under reduced pressure and then under normal pressure although this is impossible to achieve with a conventional solvent-based varnish, for example, a polyimide varnish. The successful flattening of the entire surface of the base substrate is attributed to the outstanding flatness of the solventless varnish.

Using the base substrate 71, skeletal conductor lines were formed by the process shown in FIGS. 8(a) through 8(i).

Figure 8A:
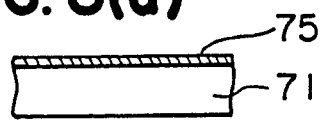
FIGS. 8(a) through 8(i) depict a flow chart for the fabrication of an interconnected multilayer board by using the base substrate of FIGS. 7(a) through 7(c)
Figure 8B:
Figure 8C:
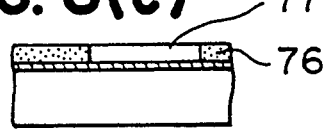
Figure 8D:
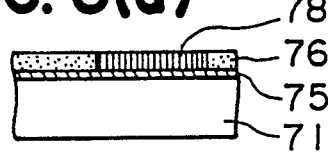

As is depicted in FIG. 8(a), a metallic under-coat layer 75 which was a sputtered, overlaid film of Cr/Cu/Cr and had a thickness of 0.5 μm was formed on the base substrate 71. A photoresist 76 was then spincoated on the metallic undercoat layer 75 as shown in FIG. 8(b). As is illustrated in FIG. 8(c), a window 77 was then formed as a window for X-layer conductor lines by exposure and development. The window 77 was filled with copper by electroplating as shown in FIG. 8(d), whereby a conductor 78 was provided for the formation of the X-layer conductor lines.

Figure 8E:
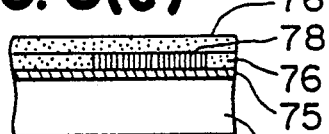
Figure 8F:
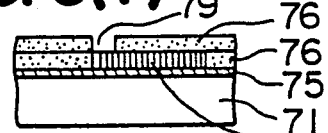
Figure 8G:
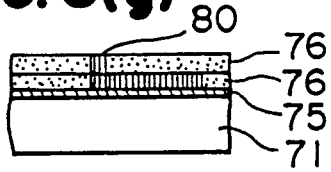

Next, as is depicted in FIG. 8(e), a photoresist 76 was coated. The photoresist 76 was exposed to radiation and developed so that a via-hole window 79 was formed as shown in FIG. 8(f). Then, as is illustrated in FIG. 8(g), the window 79 was filled with copper by using as a plating electrode the conductor 78 for the formation of the X-layer conductor lines, whereby a via-hole conductor 80 was formed.

Figure 8H:
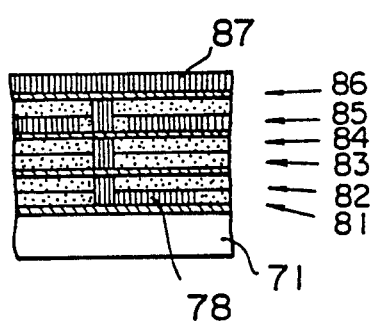
Figure 8I:
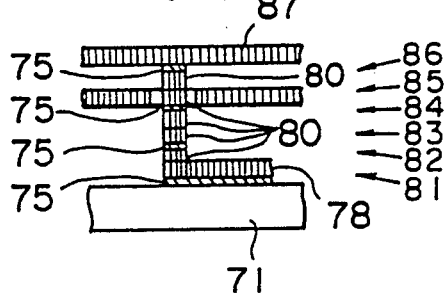

Following the above procedures, as is shown in FIG. 8(h), multilayer metallization was conducted in the order of the X conductor layer→a via-hole layer 82→a Y conductor layer 83→a via-hole layer 84→gland layer (including via-holes) 85→via-hole layer 86. On the uppermost layer, a fixing plate 87 was attached in a same manner as in Example 1. Next, simultaneous removal of the photoresist layers by a particular solvent and concurrent etching removal of the metallic under-conductor layers by a specific etchant were conducted successively, whereby conductor lines of such a skeleton structure as shown in FIG. 8(i) were formed.

The skeleton structure was then impregnated with a fluoropolymer varnish, followed by the drying and curing of the varnish so that coating was formed on the skeletal conductor lines. A benzocyclobutene polymer was formed by injecting and filling a 1:1 mixture (in an oil form) of m-bis(benzocyclobutenyl)benzene and o-bis(benzocyclobutenyl)benzene as a solventless varnish under reduced pressure and then curing the mixture at a temperature higher than 250° C. As opposed to the above-described polymer treatment, the filling of the solventless varnish is applied to the conductor lines of the skeleton structure located between the fixing plate and the base substrate while using the fixing plate as an upper mold and the base substrate as a lower mold.

The former treatment with the fluoropolymer varnish is to make use of its excellent property that the dielectric constant is 2.2. The dielectric constant of the benzocyclobutene polymer is 2.7, which is lower than those of ordinary polymers. The above benzocyclobutene polymer was however chosen in view of its low dielectric constant and also in view of its chemical structure permitting the formation of a voidless, high heat-resistant (glass transition point≧280° C., thermal decomposition temperature≧400° C.), solventless polymer.

Very poor mass productivity was a problem of interconnected multilayer boards because their fabrication process contains an unduly large number of steps. To overcome this problem, the present invention avoids the use of dry etching, which requires many steps, as much as possible except for the substrate-flattening step, and owing to the simultaneous removal of photoresist layers, the concurrent removal of metallic under-conductor layers, and the simultaneous impregnation, casting and filling with the polymer, the fabrication process of the present invention requires steps as few as one third or less of those of the conventional pedestal process. Further, the fixing plate can be etched off at the end of the process, and the same process can then be repeated to stack similar interconnected multilayer boards one over another. It is also possible to provide an interconnected multilayer board, which is constructed of two or more interconnected multilayer board of the above-mentioned type, by separately fabricating the two or more interconnected multilayer boards and then connecting them together with the brazing material such as gold-germanium.

EXAMPLE 11

When the conductor lines of a skeleton structure become smaller in diameter, the conductor lines which extend through a space may slack in some instances so that their positional accuracy could be deteriorated. Such slack may cause problems in the case of X- or Y-layer crossover conductor lines whose lengths are extremely longer compared to their widths. In such instances, it is describe to construct the skeletal conductor lines in such a way that the X- or Y-layer conductor lines can be fixed by an underlying insulating film. The underlying insulating layer contains via-holes. To the conductor lines in the X-layer, the via-hole conductors are connected at their proximal ends.

To construct one set of signal lines, X-layer conductor lines are formed first of all on a base substrate. Via-holes are then formed on the X-layer conductor lines. At this stage, a photoresist and a metallic under-conductor layer are dissolved off as already described in detail. Thereafter, a solventless, heat-resistant varnish composed of bisbenzocyclobutene (in a oil form, a mixture of the 3,3'-isomer, 3,4'-isomer and 4,4'-isomer) is injected under reduced pressure. The varnish is cured under heat, thereby fixing the entire conductor lines. Since the solventless, heat-resistant varnish has a low viscosity and is superior in achieving flatness, the top surface has very little ruggedness even when the resultant interconnected multilayer board is resin-molded in this stage. Further, the interconnected multilayer board can be subjected in its entirety to dry etching to expose the via-hole conductors. This makes it possible to continue the operation to the process for the formation of conductor lines in the next Y-layer and still further layer or layers.

A top plate can be provided above the via-holes at this time. The top plate serves as an upper mold when the skeletal conductor lines are filled with a solventless, heat-resistant varnish. Therefore, it also serves to make flat the upper surface of the solventless, heat-resistant varnish and to prevent the vertical position of the upper surface from becoming higher than the boundary between the via-holes and the top plate. When the top plate is subsequently removed by wet etching or the like, exposed via-holes appear. When the top plate is in the form of a mesh or grid, its openings are filled with the solventless, heat-resistant varnish. It therefore becomes necessary to remove, by dry etching, the solventless, heat-resistant varnish in the opening while using the top plate as a mask after the curing.

No matter how the above process is practiced, the above process makes it possible to continuously form an X-layer and via-holes on a base substrate although their formation is conducted successively, to dissolve and remove photoresist layers together at once and metallic under-conductor layers together at once, and then to simultaneously filling two layers of spaces with a solventless, heat-resistant varnish and then cure the varnish.

Owing to the vacuum impregnation, the insulating layers are voidless in this example. To materialize a thickness of several tens micrometers, a solvent-based varnish requires to coat it several operations. Since a solventless varnish is free from occurrence of by-products such as water liberated upon condensation and requires no solvent evaporation, it is possible to achieve any thickness by a single filling operation and a single curing operation. A solventless varnish of cyclobutene type is used. This varnish is inert to the material of conductor lines even when the material is Cu or the like. It is thus unnecessary to protect the surface of Cu.

Multilayer metallization is then carried out in the order of a Y-layer→via-holes→a gland layer, including via holes→via-holes. A top plate can be provided above the last-mentioned via-holes in a similar manner to the method described above. The gland layer and top plate are supported and fixed by circular or rectangular columns which extend from the base substrate.

These circular or rectangular columns can be formed similarly to via holes. It is the same as the foregoing that a solventless, heat-resistant varnish is cast and cured under heat after the removal of photoresist layers and metallic under-conductor layers.

When the formation of two layers of X layer→to via-holes and the formation of four layers of Y layer→via-holes→gland layer (including via-holes)→via-holes are repeated alternately, signal layers can be repeatedly stacked one over another. As has been described above, the present invention has the advantages that slack cross-over conductor lines can be eliminated in a skeleton structure and the number of steps can be reduced to one third or less of those of the conventional pedestal process.

EXAMPLE 12

Incorporation of thin-film resistors in an interconnected multilayer board can bring about significant advantageous effects for the improvement of the packaging density. It is however necessary to build in a number of resistors. Once they are built in, it is difficult to control all the necessary resistance values within their corresponding ranges specified. It is hence preferred to form a resistor arrangement beforehand in a fabrication line different from a multilayer metallization fabrication process line for interconnected, thin-film, multilayer boards and then to package it in interconnected multilayer boards.

A resistor arrangement to be employed here is in advance subjected to heat treatment at high temperatures to anneal their resistance values. Although an interconnected multilayer board is subjected to heat treatment in a step different from its multilayer metallization process after the resistor network has been packaged on the interconnected multilayer board, the advance heat treatment of the resistor network can minimize variations in resistance value in the multilayer metallization process. It is also desired to conduct in advance the attachment of electrodes, the formation of via-holes and the formation of expanded layers and conductor layers, depending on the manner of packaging.

Figure 10A:
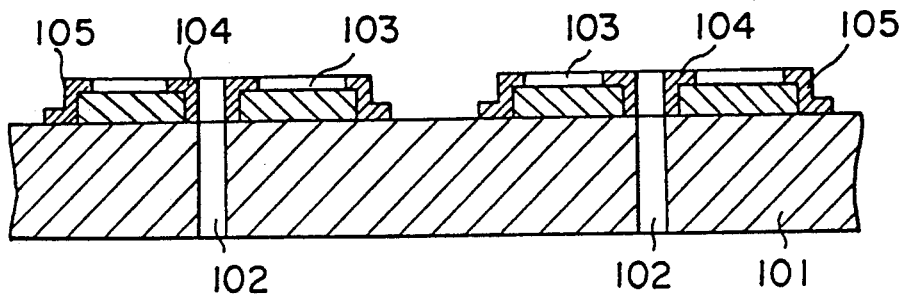
FIG. 10(a) is a fragmentary cross-sectional view showing an exemplary thin-film resistor element suitable for incorporation in an interconnected multilayer board and FIG. 10(b) is a fragmentary plan view of the thin-film resistor element of FIG. 10(a)
Figure 10B:
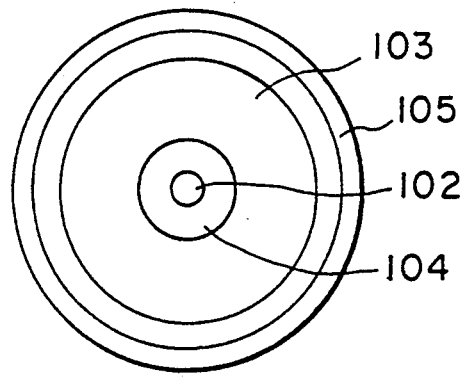

One example of the construction of such a builtin, thin-film resistor network is illustrated in FIGS. 10(a) and 10(b).

The thin-film resistor network shown in the same figure has been formed by providing ring-shaped, thin resistor films 103 on a base substrate 101, in which a through-holes 102 are formed therethrough, around the through-holes 102; providing electrodes 104 inside the inner peripheries of the thin resistor films 103 to connect the thin resistor films 103 to the outside of the resistor film; and providing corresponding electrodes 105 around the outer peripheries of the resistor films. The electrodes can be provided in the multilayer metallization process after the resistor film has been packaged.

To reduce variations among substrates, the control of the resistance value of each thin resistor film 103 is effected by adjusting the inter-electrode distance or by oxidizing or reducing the resistor film. To reduce variations within the same substrate, the control is effected by laser trimming.

The formation of each through-hole 102 can be effected by laser boring or by the combination of photolithography and wet or dry etching.

Usable examples of the base substrate 101 on films, for example, ceramic and glass films and organic films, for example, polyimide films, which are desirably as thin as possible. It is also possible to use an inorganic film or organic film formed for reinforcement on a metal plate such as a Zn, Ni or Al film which can be etched out subsequently.

EXAMPLE 13

As method for mounting one or more resistor networks fabricated as described above, there are methods in which (1) one or more resistor networks are mounted on conductor lines of a skeleton structure, (2) a conductive film is formed on the uppermost resist layer and one or more resistor networks with a bond or adhesive applied thereto are mounted on the conductive film, and (3) one or more resistor networks are mounted on an interconnected multilayer board in which a solventless heat-resistant varnish is in a heat-cured state and terminals are exposed.

Figure 11:
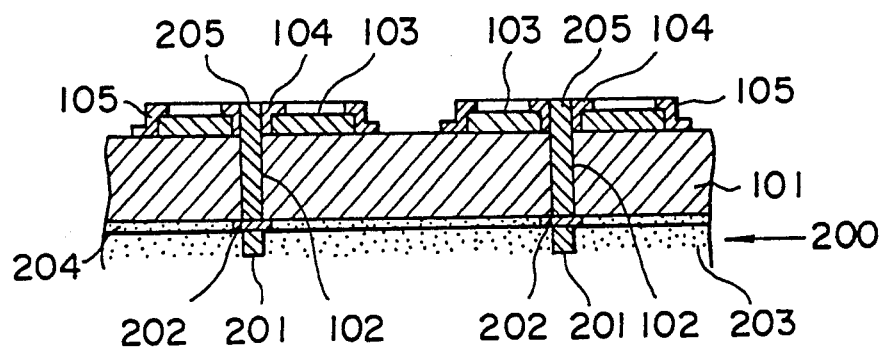
FIG. 11 is a fragmentary cross-sectional view showing, by way of example, an interconnected multilayer board and thin-film resistor elements mounted thereon.

FIG. 11 illustrates one embodiment of the present invention, in which a thin-film resistor network is mounted on an interconnect multilayer board. A thin-film resistor network is to be mounted on a layer 200 of an interconnected multilayer board. Using a resist 203, a pattern is set firstly on the layer 200. A conductor, for example, copper is then caused to grow by electroplating or the like, whereby conductors 201 are formed. Cr/Cu/Cr films are then formed on the respective via-hole conductors 201, for example, by sputtering, followed by the arrangement of pads 202 in a state electrically connected to the respective via-hole conductors 201. These pads 202 serve to absorb any errors in the positional alignment between the via-hole conductors 201 and the through-holes 102 of the resistor network, so that their electrical connection is ensured. The pads 202 can therefore be omitted when the via-hole conductors 201 and/or the through-holes 102 are formed with a large diameter.

The resistor network is next fixed, for example, with an adhesive 204 on the upper surface of the mount layer 200 of the interconnected multilayer board while the pads 202 and their corresponding through-holes 102 are being brought into alignment. The insides of the through-holes 102 are thereafter etched by dry etching, so that organic matters such as the adhesive present in the bottoms thereof are removed and Cr of the pads 202 are etched off to expose Cu. Cu is then filled in the through-holes 102, thereby forming via-hole conductors 205. By these via-hole conductors 205, the electrodes 104 of the resistor network are connected to the corresponding via-hole conductors of the interconnected multilayer board.

Although not shown in FIG. 11, the resistor network is provided with other via-hole conductors which are not connected to any of the resistor films 103. These via-hole conductors are isolated from the above-described common electrodes.

In the above-described example, the electrodes 104,105 have been provided in advance. They can however be provided after the via-hole conductors 205 are provided. Where the through-holes 102 can be enlarged to certain extent in diameter formed and their walls can be formed oblique, the connection can also be achieved without plating of the conductors by forming the electrodes 104, which are formed by sputtering, such that they directly contact at one ends to the corresponding pads 202.

In the above-described embodiment, the side on which the resistor films are provided is used as an upper side. The resistor network may however be mounted with the resistor-film-carrying side down.

It is also to be noted that the resistor network may be suitably mounted, for example, immediately above the base substrate, between adjacent two of conductor layers formed in multiple layers, in an expanded layer, or in the uppermost layer. Upon arrangement of a resistor network on another resistor network, one or more conductor layers such as expanded layers can also be provided in combination.

The mounting step for the resistor network can be carried out in the course of the successive formation of the individual layers for the formation of the above-described skeleton structure. Suitable arrangement of such resistor networks in layers allows the resistor networks to function as a reinforcing plates upon provision of the skeleton structure.

When a resistor network is mounted in an intermediate layer or the uppermost layer of the skeleton structure, the resistor network can also be provided after the filling and curing of the heat-resistant, solventless varnish. Even in this case, the connection of electrodes is still easy as the heat-resistant, solventless varnish is excellent in flatness.

The above-described resistor network is suited for being mounted on an interconnected multilayer board of a skeleton structure. This should not however be taken in a limiting sense. It can also be mounted on an interconnected multilayer board which has been obtained by the conventional stepwise multilayer metallization technique making use of a conventional, solvent-based varnish. The mounting method described above can also be used in this case.

Devices which can be mounted or packaged are not limited to resistors, but various other circuit devices such as capacitors can also be mounted or packaged.

A description will next be made of the effect of the present invention for the decrease of the number of steps in connection with the above-described various examples of this invention.

When a board of n layers is fabricated by the stepwise multilayer metallization technique making use of a conventional solvent-based varnish, 5 n times of operations are required in total, which include n times of operations for the formation of windowed resist layers, including resist coating, exposure, development and fixing, n times of operations for their removal, n/2 times of operations for the formation of metallic under-conductor layers, also n/2 times of operations for their removal, n times of operations for coating the solvent-based varnish, and n time of operations for conducting flattening by grinding and polishing.

On the other hand, the fabrication process of the present invention requires $(3/2 \times n + 2)$ operations in total, which include n times of operations for the formation of windowed resist layers, 1 times of operation for their removal, n/2 times of operations for the formation of metallic under-conductor layers, 1 times of operation for their removal, 1 times of operation for filling a solventless varnish, and no grinding/polishing operation.

Assume that 30 layers are stacked one over another. The conventional process requires 150 steps, while the process of the present invention requires only 48 times. The number of steps can therefore be decreased, roughly calculating, to ⅓.

As has been described above, the process of the present invention can easily achieve voidless insulation and, owing to the omission of grinding and polishing steps, is free from occurrence of dust particles which tend to a cause for defects.

In addition to the above-described improvements in reliability and fabrication yield, an inorganic insulating substrate made of ceramic by way of example can be arranged as a top layer or an intermediate layer. This makes it possible to provide a thermal expansion coefficient conforming with LSI, leading to further an improvement in the reliability of connection. Further, circuit devices such as thin-film resistors and capacitors can be built-in, resulting in the advantageous effects that both function and package density can be improved significantly. Various these advantageous effects can be attributed to the advances of the board fabricating process and the solventless heat-resistant polymer materials and their synergistic effects, said advances and effects have all been brought about by the present invention.

EXAMPLE 14

Fabrication of Module

Figure 12:
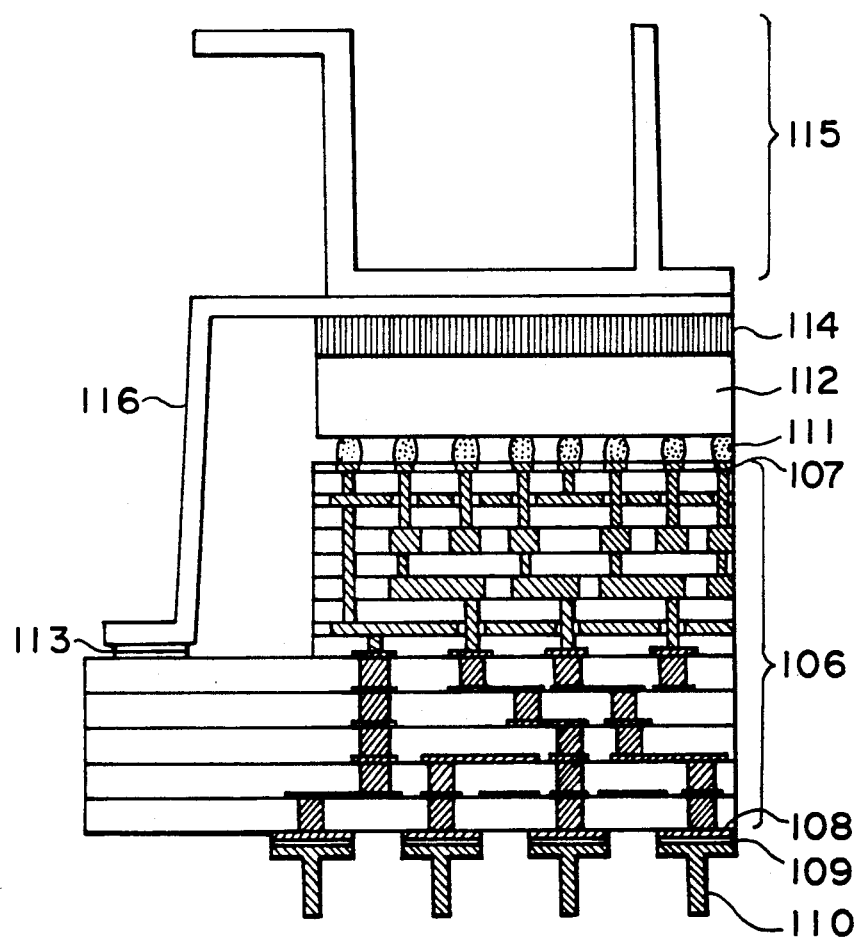
FIG. 12 is a cross-sectional view of a thick film-thin film hybrid module according to the present invention.

FIG. 12 is a schematic of a module fabricated in this example. High-temperature solders 109 were placed on pinning pads 108 which were provided on a rear side of a thick film-thin film hybrid board fabricated by using the interconnected multilayer board obtained in Example 1. Only connecting parts were locally heated to about 350° C., whereby pins 110 inserted in guide holes were connected and fixed. Solders 111 were next placed on pads 107 provided on a front side of the board, said pad being adapted to mount semiconductor devices. The solders 111 were heated to about 250° C., whereby four LSIs 112 were electrically connected and fixed. Further, a heat-resistant rubber pad 114 having good electrical and heat conductivities was adhered to back sides of the LSIs. Finally, low-temperature solder 113 was placed on a solder sealing part on the front side of the board and was heated to about 200° C., whereby a Kovar sealing cap 116 having a cooling fin 115 integrally molded therewith for cooling the LSIs was connected in such a way that the inner wall of the sealing cap was maintained in contact with the heat-resistant rubber having good thermal conductivity. As a result, the module was completed.

As the LSIs for the above module, one logic LSI and three memory LSIs were used.

Construction of a Computer

Figure 13:
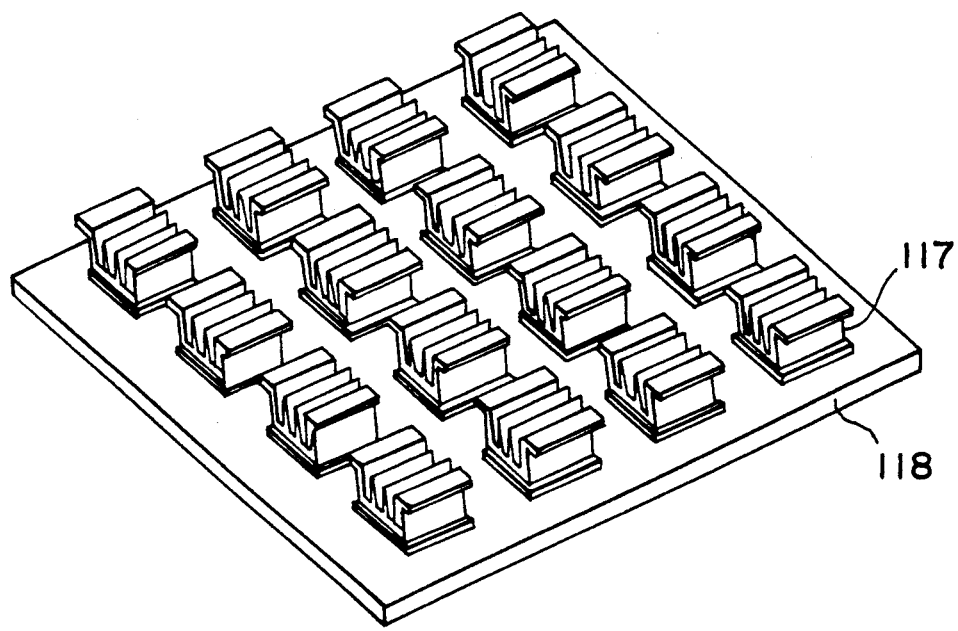
FIG. 13 is a perspective view of a logic package according to the present invention, which is suitable for use in a computer.

Sixteen modules 117 were mounted on a printed circuit board 118, whereby a logic package shown in FIG. 13 was formed.

The logic package was combined with a memory package and an I/O processor package to construct a computer.

EXAMPLE 15

A solventless varnish which had been prepared by mixing 4,4'-bisbenzocyclobutene and 1,4-bis(phenylethynyl)benzene at a molar ration of 5:5 was heated at 200° C. for 20 minutes under nitrogen for oligomerization. The resultant varnish was spincoated at 100° C. for 30 seconds to an aluminum conductor layer 303 on a silicon substrate 301 (see FIG. 14), which was rotated at 2,000 rpm. The thus-coated aluminum conductor layer was heated for 1 hour in an nitrogen atmosphere of 30° C., whereby an insulating film 304 of 8 μm (glass transition point: 280° C., thermal decomposition temperature: 400° C.) was formed (see also FIG. 14).

4,4'-Bisbenzocyclobutene employed above is represented by the formula (1) in which R (bonding group) is not contained and the two benzocyclobutene rings are bonded together directly.

On the other hand, 1,4-bis(phenylethynyl)benzene also employed above is represented by the formula (20 in which X stands for a benzene ring, and Y and Y' are represented by

n and R being 1 and a benzene ring respectively.

EXAMPLE 16

To form the insulating layer 304 in FIG. 14, was used a 8:2 (by molar ratio) copolymer (glass transition point: 300° C., thermal decomposition temperature: 420° C.) of 4,4'-bisbenzocyclobutene and 1,4-diphenylbutadiene.

4,4'-bisbenzocyclobutene employed above was the same as that used in Example 15.

On the other hand, 1,4-diphenylbutadiene is represented by the formula (2) in which X denotes a direct bond and Y and Y' have the same meaning as in Example 15.

EXAMPLE 17

To form the insulating layer 304 in Example 15, was used a 7:3 (by molar ratio) copolymer (glass transition point: 290° C., thermal decomposition temperature: 410° C.) of 4,4'-bisbenzocyclobutene and 4-ethynylphenylphenylacetylene.

4,4'-Bisbenzocyclobutene used above is identical to that employed in Example 15.

On the other hand, 4-ethynylphenylphenylacetylene is represented by the formula (2) in which X means a benzene ring, Y is represented by

n and R being 1 and a hydrogen atom respectively, and Y' is represented by

n and R being 1 and a benzene ring respectively.

EXAMPLE 18

To form the insulating layer 304 in Example 15, was used a 5:5 (by molar ratio) copolymer (glass transition point: 280° C., thermal decomposition temperature: 400° C.) of 1,4-bisbenzocyclobutene and 1,4-diphenylbutadiene.

1,4-Bis(benzocyclobutenyl)benzene is represented by the formula (1) in which R stands or a benzene ring, while 1,4-diphenylbutadiene is the same as that employed in Example 16.

EXAMPLE 19

To form the insulating layer 304 in Example 15, was used a 7:3 (by molar ratio) copolymer (glass transition point: 295° C., thermal decomposition temperature: 420° C.) of 1,4-bis(benzocyclobutenyl)benzene and bis(phenylethyl)acetylene.

p-Bis(benzocyclobutenyl)benzene is represented by the formula (1) in which R is a benzene ring, while bis(phenylethynyl)acetylene is represented by the formula (2) in which X is a direct bond, Y is represented by

n and R being 1 and a benzene ring respectively, and Y' is represented by

n and R being 2 and a benzene ring respectively.

EXAMPLE 20

Upon formation of multilayer conductor films, through-holes are formed in respective insulating layers so as to interconnect the individual conductor films by conductors.

In such a case, by a process as illustrated in FIG. 15(a) through 15(f), a through-hole conductor 305 is formed in the insulating film 304, followed by the formation of a second conductor layer over the insulating film 304. This process is similarly repeated to form multilayer conductor films.

Figure 15A:
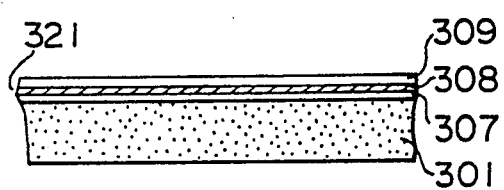
FIGS. 15(a) through 15(f) show individual steps for the fabrication of a silicon substrate having an insulating film of a poly(benzocyclobutene) polymer.

In FIG. 15(a), a thin chromium film 307, a thin copper film 308 and a thin chromium film 309 are successively overlaid on the silicon substrate 301, so that a conductor film 321 is formed.

Figure 15B:
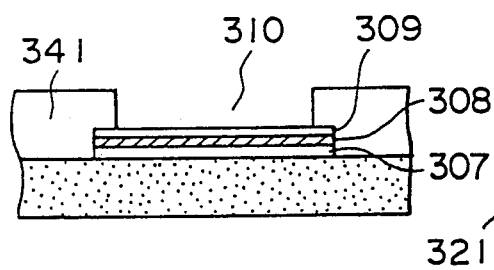

Then, as is illustrated in FIG. 15(b), the conductor film 321 is subjected to dry etching or the like to form a desired pattern of conductor lines. After an insulating film 341 is formed on the conductor lines by using one of the copolymers described in Examples 15-19, a viahole 310 is formed.

Figure 15C:
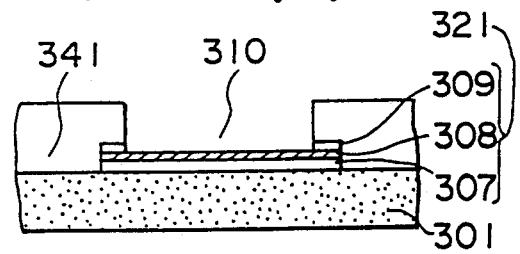

Reference is next made to FIG. 15(c). The thin chromium film 309 is selectively etched off with a potassium ferricyanide/potassium hydroxide solution while the insulating film 341 is being used as a mask.

Figure 15D:
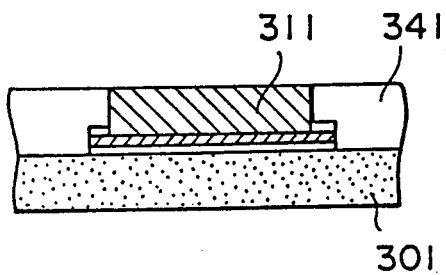

Next, as is depicted in FIG. 15(d), selective electroless plating is conducted using the insulating film 341 as a plating resist so that a copper plating layer 311 is formed.

Figure 15E:
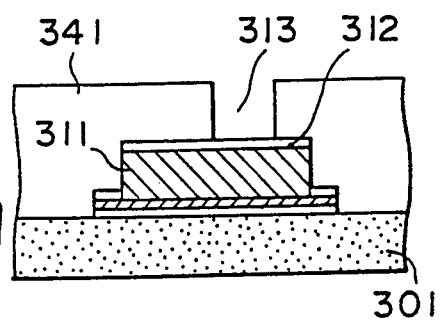
Figure 15F:
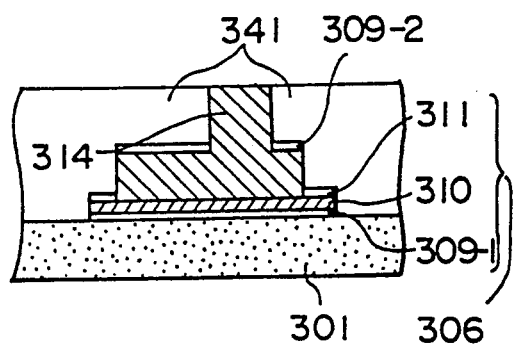

Reference is next made to FIG. 15(e). A chromium plating layer 312 is formed by electroless plating on the copper plating layer 311 while the insulating film 341 is being used as a plating resist. In a manner similar to FIG. 15(b), another insulating film 341 of the same type as the first-mentioned insulating film is overlaid and a via-hole 313 is then formed. Next, as is shown in FIG. 15(f), the thin chromium film 312 is selectively etched off while the second-mentioned insulating film 341 is being as a mask. A copper plating layer 314 is then formed within the via-hole 313 by selective electroless plating.

Since the top surface of the assembly formed as shown in FIG. 15(f) is flat, the next conductor and insulating films can be overlaid by a similar process to the process described above.

The wafers obtained in Examples 15-20 respectively, each of which carries a conductor line structure according to the present invention (including the insulating film 341), subjected to a pressure cooker test for 150 hours in steam of 2 atm and 121° C. Even after the test, no corrosion was observed on their conductor films. They hence had extremely good moisture resistance.

In contrast, wafers with an insulating film of the conventional PIQ material developed corrosion of conductor lines in about 80 hours when they were subjected to a similar pressure cooker test.

It is therefore understood that use of the conductor line structure of the present invention can significantly improve the moisture resistance and reliability of devices having multilayer conductor films fabricated by thin-film technology, such as ICs, LSIs and the like.

Further, the conductor line structure according to the present invention has a thermal expansion coefficient of a level similar to or lower than that of the conductor film at the heat curing temperature thereof so that no mechanical stress is applied to the conductor film. Accordingly, the conductor film is protected from deformation and disconnection during the fabrication of the conductor line structure.

Further, the insulating films or layers in the conductor line structure according to the present invention have a non-polar molecular structure and strong alkali resistance. When the individual conductor films are plated one after another in the course of the formation of the multilayer structure, the conductor line structures which have already been formed are protected from corrosion and deformation. As a result, the multilayer conductor films can be easily formed with a high degree of reliability.

In addition, the viscosity of the oligomerized varnish of the present invention, which is adapted to form insulating films, can be adjusted as needed, whereby an insulating film of a desired thickness can be formed by a single coating operation. As a result, the efficiency of the fabrication process has been improved.

Furthermore, the oligomerized varnish of the present invention, said varnish being useful for the formation of insulating films, does not undergo shrinkage by its heat and curing treatment, so that a finished surface of high flatness can be obtained. This facilitates the formation of additional conductor films, insulating films and the like to be overlaid thereon and, at the same time, improves their reliability.

The insulating films so formed in accordance with the present invention contain neither voids nor pin-holes therein, thereby making it possible to obtain multilayer conductor films having high reliability.

EXAMPLE 21

Conductor lines had been fabricated in advance, following the conventional steps of FIGS. 9(a) through 9(e) of the flow chart showing the conventional process for the fabrication of an interconnected multilayer board.

As is shown in FIG. 16(a), a coating of 4,4'-bisbenzocyclobutene oligomer of 45 $\mu$m thick which had been formed by coating a hot plate of surface flatness as high as at least $\pm 0.5$ $\mu$m with the oligomer was thoroughly dried at 80° C. under reduced pressure, whereby the coating was brought into a solventless state.

Spaces of the conductor lines formed as described above (width: 20 $\mu$m, pitch: 40 $\mu$m, height: 40 $\mu$m) were firstly filled with polyimide powder of 10-15 $\mu$m in diameter ("UIP-S", trade name; product of UBE INDUSTRIES, LTD.). The coating of 4,4'-bisbenzocyclobutene oligomer, which was held in the solventless state on the hot plate, was pressed downwardly against the conductor lines. The entire system was once maintained under reduced pressure. A load of about 15 kg/cm$^2$ was then applied to the hot plate and, at 120° C., the oligomer was caused to melt and flow into the spaces and filled them out. Under a hydrostatic pressure of 20 kg/cm$^2$, the hot plate was rapidly heated to 250° C. by electromagnetic induction and the oligomer was cured over about 30 minutes. Substantially no polymer remained between the via-hole copper and the hot plate, and the flatness of at least $\pm 0.5$ $\mu$m of the hot plate was transferred to the entire surface of the resulting conductor layer. Owing to the application of the pressure after the depressurization and the nature of the oligomer that no solvent was contained and on water was byproduced upon curing, neither pinholes nor voids were observed in the resultant polymer. After the hot plate was removed, the surface of the conductor layer was etched off by dry etching so that the via-hole copper was exposed. Conductor layers were overlaid one by one in the manner as described above, whereby a desired, interconnected 10-layer board was fabricated.

EXAMPLE 22 p-Bisbenzocyclobutenylethenylbenzene oligomer was spincoated to a thickness of 45 $\mu$m on a hot plate which had surface flatness of at least $\pm 0.5$ $\mu$m and permitted electromagnetic induction heating. The oligomer so coated was dried at 80° C. under reduced pressure, whereby a prepreg was prepared in a solventless state.

Spaces of conductor lines (width: 20 $\mu$m, pitch: 40 $\mu$m, height: 40 $\mu$m), which had been formed in a similar manner to Example 21, were filled with aramid fibers ("TEKNOLA", trade mark; product of Teijin Limited). The hot plate was then downwardly pressed against the conductor lines and the entire system was once maintained under reduced pressure. Under a load of about 20 kg/cm$^2$, the hot plate was next heated to 100° C., so that the oligomer was caused to melt and flow and filled the spaces between the conductor lines. Under a hydrostatic pressure of 20 kg/cm$^2$, the hot plate was rapidly heated to 250° C. and the oligomer was cured for about 30 minutes. The hot plate was then removed, and the surface of the conductor layer was etched off by dry etching so that the via-hole copper was exposed. The above procedures were repeated, whereby an interconnected 15-layer board was fabricated.

EXAMPLE 23 m-Bisbenzocyclobutenylbenzene oligomer, which contained about 30 wt. % of polyimide powder of 7-12 μm in diameter ("UIP-S", trade name; product of ABE INDUSTRIES, LTD.) mixed therein, was coated by a roller on conductor lines (width: 20 μm, pitch: 40 μm, height: 40 μm) formed in a similar manner to Example 21. The solvent was evaporated at 80° C. under reduced pressure. A hot plate having surface flatness of at least ±0.5 μm was placed on the conductor layer. While a hydrostatic pressure of 30 kg/cm$^2$ was being applied, the hot plate was rapidly heated to 250° C. and the oligomer was cured for 30 minutes. The hot plate was removed and the conductor layer as then subjected to dry etching until the via-hole copper was exposed. The above procedures were repeated, whereby an interconnected 5-layer board was fabricated.

EXAMPLE 24

Bisbenzocyclobutenylethene oligomer was spin-coated to a thickness of 45 μm on a hot plate having surface flatness of at least ±0.5 μm. The solvent was evaporated at 80° C. under reduced pressure, so that a prepreg was prepared in a solventless state. In the meantime, spaces between conductor lines (width: 25 μm, pitch: 50 μm, height: 40 μm) were filled with polyimide powder of 10-15 μm in diameter [mixed powder consisting of 40 wt. % of "UIP-R40" and 60 wt. % of "UIP-S" (both, trade names; products of the UBE INDUSTRIES, LTD.)]. In addition, a fluorine-containing surfactant was applied only to the upper surface of the conductor lines. The hot plate with the oligomer film carried thereon was downwardly pressed against the conductor lines between which the polyimide powder had been filled, followed by the elimination of air under reduced pressure. The hot plate was then rapidly heated to 80° C. under a load of 20 kg/cm$^2$. The oligomer was hence heated. The oligomer was thus caused to melt and flow, so that the spaces between the conductor lines were filled with the oligomer. Under a hydrostatic pressure of 25 kg/cm$^2$, the hot plate was rapidly heated to 250° C. and the oligomer was cured for 30 minutes. The hot plate was then removed, and the surface was etched off by dry etching to expose the via-hole copper. The above procedures were repeated, whereby an interconnected 15-layer board was fabricated.

EXAMPLE 25

4,4'-Bisbenzocyclobutene oligomer, which contained about 40 wt. % of polyimide powder of 7-12 μm in diameter ("UIP-S", trade name; product of UBE INDUSTRIES, LTD.) mixed therein, was coated by a roller on conductor lines (width: 20 μm, pitch: 40 μm, height, 40 μm) formed in a similar manner to Example 21. Volatile components were evaporated at 80° C. under reduced pressure, whereby the thus-coated conductor lines were brought into a solventless state. A hot plate having surface flatness of at least ±0.5 μm was placed on the conductor layer. While a hydrostatic pressure of 30 kg/cm$^2$ was being applied, the hot plate was rapidly heated to 250° C. and the oligomer was cured for 30 minutes. The hot plate was removed and the conductor layer was then subjected to dry etching until the via-hole copper was exposed. The above procedures were repeated, whereby an interconnected 10-layer board was fabricated.

EXAMPLE 26

4,4'-Bisbenzocyclobutene oligomer, which contained about 50 wt. % of polyimide powder of 7-12 μm in diameter ("UIP-S", trade name; product of UBE INDUSTRIES, LTD.) mixed therein, was coated by a roller on conductor lines (width: 20 μm, pitch: 40 μm, height: 40 μm) formed in a similar manner to Example 21. Volatile components were evaporated at 80° C. under reduced pressure, whereby the thus-coated conductor lines were brought into a solventless state. A hot plate having surface flatness of at least ±0.5 μm was placed on the conductor layer. While a hydrostatic pressure of 30 kg/cm$^2$ was being applied, the hot plate was rapidly heated to 250° C. and the oligomer was cured for 30 minutes. The hot plate was removed and the conductor layer was then subjected to dry etching until the via-hole copper was exposed. The above procedures were repeated, whereby an interconnected 10-layer board was fabricated.

EXAMPLE 27

4,4'-Bisbenzocyclobutene oligomer, which contained about 70 wt. % of polyimide powder of 7-12 μm in diameter ("UIP-S", trade name; product of UBE INDUSTRIES, LTD.) mixed therein, was coated by a roller on conductor lines (width: 20 μm, pitch: 40 μm, height: 40 μm) formed in a similar manner to Example 21. Volatile components were evaporated at 80° C. under reduced pressure, whereby the thus-coated conductor lines were brought into a solventless state. A hot plate having surface flatness of at least ±0.5 μm was placed on the conductor layer. While a hydrostatic pressure of 30 kg/cm$^2$ was being applied, the hot plate was rapidly heated to 250° C. and the compound was cured for 30 minutes. The hot plate was removed and the conductor layer was then subjected to dry etching until the via-hole copper was exposed. The above procedures were repeated, whereby an interconnected 10-layer board was fabricated.

EXAMPLE 28 cis-Bisbenzocyclobutenylethene oligomer, which contained about 80 wt. % of polyimide power of 7-12 μm in diameter ("UIP-S", trade name; product of UBE INDUSTRIES, LTD.) mixed therein, was coated by a roller on conductor lines (width: 20 μm, pitch: 40 μm, height: 40 μm) formed in a similar manner to Example 21. Volatile components were evaporated at 80° C. under reduced pressure, whereby the thus-coated conductor lines were brought into a solventless state. A hot plate having surface flatness of at least ±0.5 μm was placed on the conductor layer. While a hydrostatic pressure of 20 kg/cm$^2$ was being applied, the hot plate was rapidly heated to 300° C. and the compound was cured for 30 minutes. The hot plate was removed and the conductor layer was then subjected to dry etching until the via-hole copper was exposed. The above procedures were repeated, whereby an interconnected 15-layer board was fabricated.

EXAMPLE 29

Conductor lines (width: 20 μm, pitch: 40 μm, height: 40 μm) were placed in a box-like container made of an RTV rubber. 4,4'-Bisbenzocyclobutene (melting point: 62° C.) was heated, injected and poured into the container in a vacuum, followed by curing treatment at a final temperature of 250° C. After the curing, the surface of the insulating layer was etched off by dry etching so that the upper ends of the via-hole copper, said copper having been buried, were exposed. A conductor substrate permitting subsequent multilayer metallization was fabricated.

EXAMPLE 30 m-Bisbenzocyclobutenylbenzene (melting point: 75° C.) was spincoated to a thickness of 45 μm on a hot plate having surface flatness of at least ±0.5 μm. The solvent was evaporated at 80° C. under reduced pressure, so that a prepreg was prepared in a solventless state. In the minute, spaced between conductor lines (width: 20 μm, pitch: 40 μm, height: 40 μm) were filled with aramid fibers ("TEKNOLE" trade mark; product of Teijin Limited). The hot plate was placed on the conductor lines. The hot plate was then heated to 170° C. under reduced pressure, whereby m-bisbenzocyclobutenylbenzene was caused to melt and flow, so that the spaces between the conductor lines, said spaces containing aramid fibers, were filled. Under a hydrostatic pressure of 30 kg/cm$^2$, the hot plate was rapidly heated to 250° C. and the compound was cured for 30 minutes. The hot plate was then removed, and the surface was etched off by dry etching to expose the via-hole copper. The above procedures were repeated, whereby an interconnected 15-layer board was fabricated.

EXAMPLE 31

Conductor lines were fabricated following the conventional steps of FIGS. 9(a) through 9(e) of the flow chart showing the conventional process for the fabrication of an interconnected multilayer board.

Figure 9A:
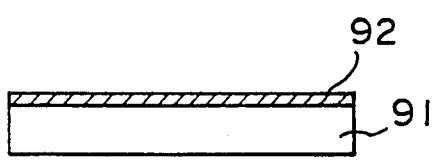
FIGS. 9(a) through 9(g) show a flow chart of a conventional process for the fabrication of an interconnected multilayer board.
Figure 9E:
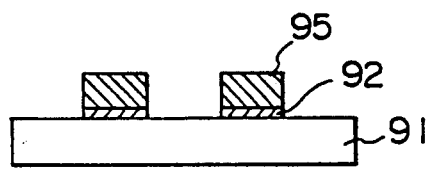
Figure 9B:
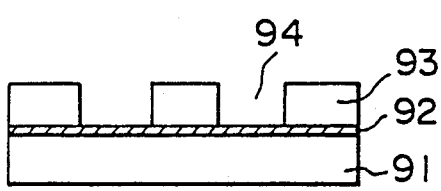
Figure 9F:
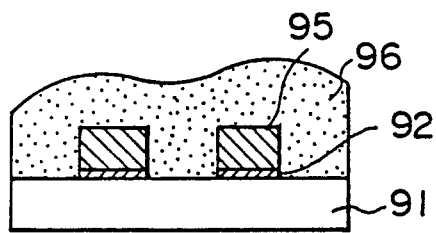
Figure 9C:
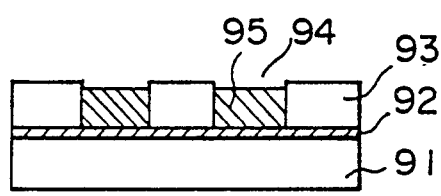
Figure 9G:
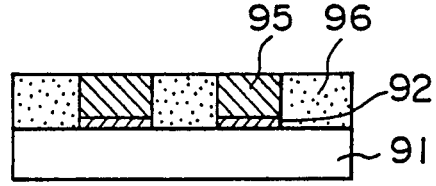
Figure 9D:
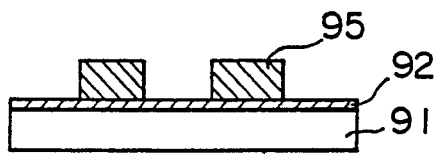

In the steps of FIG. 9(f) onwards, spaces of the conductor lines were filled out with an epoxy resin composition (glass transition point: 330° C.) in place of the conventional polyimide materials, said composition being composed of a naphthalene-ring-containing tetrafunctional epoxy resin and methylenedianiline, so that an insulating layer was formed. The epoxy resin employed here was a tetrafunctional epoxy resin obtained by epoxylating a compound—which contained a 1,6-hydroxynaphthalene ring at the center and phenol rings bonded to opposite ends of the 1,6-hydroxynaphthalene ring via methylene bonds, respectively—with epichlorohydrin ("EXA-4750", trade name; product of Dainippon Ink and Chemicals, Inc.). This epoxy resin has extremely good heat resistance that has not been seen to date (conventional glass transition points ≦200° C.) and is not inferior in heat resistance to polyimide of ordinary grade. As a coating method for the epoxy resin, the epoxy resin was dissolved in an organic solvent such as methyl ethyl ketone and then spincoated repeated. The coating thus applied was precured to have the solvent evaporated, so that the coating was brought into a solventless state. Above 100°-110° C., the epoxy resin composition was caused to melt and flow into a flat film, followed by curing at 170° C. for 2 hours. Upon curing, the film was subjected depressurization and then pressurization. Compared to polyimides whose curing requires, at the maximum, several hours at 350° C. or higher, it was possible to cure the epoxy resin composition at the lower temperature in the shorter time. Finally, the surface was etched off by dry etching so that the upper ends of the via-hole copper were exposed. Since the surface becomes substantially rough in the case of polyimides, dry etching is not applied directly but the surface must in advance be flattened by mechanical processing. In the case of the epoxy resin composition, no mechanical processing is required because the epoxy resin composition has excellent flatness.

A via-hole layer had been formed by the above procedures. The efficiency can be improved further provided that the conductor lines in the X or Y direction and via-holes located above the conductor lines are simultaneously subjected to insulating treatment. Further, as in Example 1, multilayered conductor lines of a skeletal structure can be subjected as a whole to insulating treatment.

EXAMPLE 32

An epoxy resin composition described in Example 31 was coated to a thickness of 40 μm on a hot plate whose surface had smoothness of at least ±0.5 μm. The solvent was then evaporated to bring the resultant coating into a solventless state. The evaporation of the solvent was conducted at low temperatures (not exceeding 80° C.) under reduced pressure by heating the hot plate. It is however to be noted that no particular limitation is imposed on the conditions for the evaporation. The solventless epoxy resin composition, which had been formed into the film on the hot plate as described above, was pressed together with the hot plate downwardly against conductor lines which had been formed in a similar manner to Example 31. Under heating, the resin was caused to melt and flow into spaces of the conductor lines so that the spaces were filled with the resin. Owing to the rapid heating of the hot plate, the resin was undergone rapid melting so that the spaces were smoothly filled out. Although the filling operation was conducted at about 100° C. under reduced pressure, no particular limitation is imposed on the filling conditions. The resin sandwiched between the upper ends of the via-hole copper and the hot plate was allowed to melt and move, so that substantially no resin remained there. As a result, the surface became flat. After the hot plate was pressed under reduced pressure as described above, the resultant structure was heated and pressed under a hydrostatic pressure. As a result, the resultant resin layer was rendered substantially void-free. Finally, the resin layer was cured at 170° C. for 2 hours by the hot plate. The surface was etched off by dry etching, whereby the via-hole copper was exposed.

EXAMPLE 33

The epoxy resin composition described in Example 31 was kneaded at low temperatures (60°-80° C.) by rolls without being dissolved in any solvent. The epoxy resin composition was then cooled and ground. Conductor lines with a hot plate placed thereon were enclosed within a mold having a gate and an outlet. While the conductor lines were being heated at 170° C. under reduced pressure by the hot plate, the resin powder so ground was melted and injected by an injection machine, followed by curing. The curing was brought to completion in about 10 minutes by raising the temperature of the hot plate to 200° C. after the resin was filled. Subsequent dry etching was carried out in a similar manner to Example 31.

EXAMPLE 34

The procedures of Example 32 were followed except that spaces between conductor lines had been filled with aramid fibers of 15 μm in diameter ("TEK- NOLA—, trade mark; product of Tiejin Limited) in advance, whereby the spaces were filled with the solventless epoxy resin. Since aramid fibers exhibit negative expansion coefficients for both heat and moisture, the resin-filled conductor layer thus obtained conveniently had small heat and moisture expansion coefficients.

EXAMPLE 35

An interconnected multilayer board was fabricated in a similar manner to Example 31 except that the epoxy resin composition was used after 50 wt. % of polyimide powder of 7–12 $\mu$m ("UIP-S", trade name; product of UBE INDUSTRIES, INC.) was added as a reinforcement. The reinforcement compensated the problem that the cured product of the epoxy resin composition has lower extensibility than polyimides, so that the interconnected multilayer board thus fabricated was a suitable board.

EXAMPLE 36

Interconnected multilayer boards were fabricated in a similar manner to Example 28 except that, as an epoxy resin composition, a composition (glass transition point: 230° C.) of an epoxy resin having naphthalene rings ("HP-4032", trade name; product of Dainippon Ink and Chemicals, Inc.) and a diamine having a biphenyl ring (4,4-diaminobiphenyl) and another composition obtained by adding the polyimide powder employed in Example 32 to the former composition were used, respectively. Excellent boards were obtained, which were curable in a short time.

EXAMPLE 37

A composition (glass transition point: 230° C.)—which consisted of a bifunctional epoxy resin containing naphthalene rings ("HP-4032D", trade name; product of Dainippon Ink and Chemicals, Inc.), said resin containing about 70% of polyimide powder of 7–12 $\mu$m in diameter ("UIP-S", trade name; product of UBE INDUSTRIES, INC.), and methylenedianiline—was filled by a roller in spaces of conductor lines (width: 20 $\mu$m, pitch: 40 $\mu$m, height: 40 $\mu$m). A hot plate whose surface roughness was at least $\pm 0.5$ $\mu$m was placed on the resulting conductor layer. The conductor lines so filled were heated to 80° C. under reduced pressure so that bubbles and the like were eliminated. A hydrostatic pressure of 30 kg/cm$^2$ was applied, the temperature was raised to 200° C., and the composition was cured for 30 minutes. The hot plate was thereafter removed, and dry etching was conducted until the via-hole copper was exposed. The above procedures were repeated to fabricate an interconnected 10-layer board. The above polyimide powder had the smaller linear expansion coefficient among polyimides, and had such low linear expansion coefficient ($0.3 \times 10^{-5}$) and high extensibility that cannot be achieved by the epoxy resin composition alone.

EXAMPLE 38

A composition (glass transition point: 230° C.)—which consisted of a bifunctional epoxy resin containing naphthalene rings ("HP-4032", trade name; product of Dainippon Ink and Chemicals, Inc.), said resin containing about 80% of polyimide powder of 7–12 $\mu$m in diameter ("UIP-S", trade name; product of UBE INDUSTRIES, INC.), and 4,4'-diamino-p-terphenyl—was filled by a roller in spaces of conductor lines (width: 30 $\mu$m, pitch: 60 $\mu$m, height: 50 $\mu$m). The resulting conductor layer was heated to 120° C. under reduced pressure so that the conductor layer was degasified. A hot plate was placed on the conductor layer. While a hydrostatic pressure of 50 kg/cm$^2$ was being applied, the temperature was raised to 200° C. and the composition was cured for 30 minutes. The hot plate was thereafter removed, and dry etching was conducted until the via-hole copper was exposed. The above procedures were repeated to fabricate an interconnected 5-layer board.

EXAMPLE 39

A composition (glass transition point: 330° C.)—which consisted of a tetrafunctional epoxy resin containing naphthalene rings ("EXA-4700", trade name; product of Dainippon Ink and Chemicals, Inc.), said resin containing about 50% of polyimide powder of 7–12 $\mu$m in diameter ("UIP-S", trade name; product of UBE INDUSTRIES, INC.), and methylenedianiline—was filled by a roller in spaces of conductor lines (width: 25 $\mu$m, pitch: 50 $\mu$m, height: 50 $\mu$m). The resulting conductor layer was heated to 80° C. under reduced pressure so that the conductor layer was degasified. A hot plate was then placed on the conductor layer. While a hydrostatic pressure of 30 kg/cm$^2$ was being applied, the temperature was raised to 200° C. and the composition was cured for 30 minutes. The hot plate was thereafter removed, and dry etching was conducted until the via-hole copper was exposed. The above procedures were repeated to fabricate an interconnected 10-layer board.

EXAMPLE 40

A composition (glass transition point: 330° C.)—which consisted of a tetrafunctional epoxy resin containing naphthalene rings ("EXA-4700", trade name; product of Dainippon Ink and Chemicals, Inc.), said resin containing about 60 % of polyimide powder of 2–7 $\mu$m in diameter (obtained by crushing the above "UIP-S" again), and 3,3'-dimethyl-4,4'-diaminobiphenyl—was filled by a roller in spaces of conductor lines (width: 20 $\mu$m, pitch: 40 $\mu$m, height: 40 $\mu$m). The resulting conductor layer was heated to 80° C. under reduced pressure so that the conductor layer was degasified. While the conductor layer was being heated by a hot plate placed on the conductor layer, a hydrostatic pressure of 30 kg/cm$^2$ was applied. The composition was fully cured at 200° C. max. for 30 minutes. The hot plate was thereafter removed, and dry etching was conducted until the via-hole copper was exposed. The above procedures were repeated to fabricate an interconnected 10-layer board.

EXAMPLE 41

Conductor lines (width: 20 $\mu$m, pitch: 40 $\mu$m, height; 40 $\mu$m) were placed in a box-like container made of an RTV rubber. By injection under heat in a vacuum, a mixture (glass transition point: 230° C.) of a bifunctional epoxy resin containing naphthalene rings ("HP-4032", trade name; product of Dainippon Ink and Chemicals, Inc.) and methylenedianiline was poured. The mixture was then cured at 200° C. The surface was etched off by dry etching so that the via-hole copper was exposed to permit the subsequent steps. The above procedures were repeated similarly to fabricate an interconnected 10-layer board.

EXAMPLE 42

In Examples 21–41, the respective resin materials were filled after the upper end surfaces of the corresponding conductor lines had been coated with a fluorine containing surfactant or polymer in advance. The upper end surfaces of the conductor lines were not wetted with the corresponding resin materials, so that no adhesion of cured resin product was observed there. The dry etching time was therefore shortened, leading to an improved throughput.

EXAMPLE 43

Using the interconnected multilayer boards fabricated by thin-film technology in Examples 21–42, modules similar to that shown in FIG. 12 were fabricated in a similar manner to Example 14. Logic packages for computers, said logic packages being similar to that illustrated in FIG. 13, were fabricated by using the modules, respectively. Computers were then manufactured by combining the logic packages with memory and I/O packages, respectively. The computers operated well.

Since modules according to the present invention are fabricated as described above and have the aforementioned construction, they have inter alia the following advantages:

(1) The time period required for the fabrication of each module can be shortened, as the present invention has substantially shortened the time required from the initiation of fabrication of interconnected multilayer boards until their completion.

(2) The fabrication yield of modules can be improved. This is attributed to the fact that, because the number of steps for the fabrication of each interconnected multilayer board can be decreased to significant extent, the fabrication yield of interconnected multilayer boards is improved, eventually leading to improvements in the fabrication yield of modules.

(3) Modules can be improved in both reliability and service life. These improvements are also attributed to the decrease in the number of steps for the fabrication of interconnected multilayer boards. For example, the number of interfaces between insulating layers has been decreased compared with the number of interfaces between insulating layers formed in accordance with the conventional stepwise formation. As a result, causes for reduced reliability, such as separation and impurity penetration at interfaces, have been rendered fewer.

Further, computers according to the present invention have inter alia the following advantages:

(1) The time period required for the manufacture of each computer can be shortened, as the present invention has substantially shortened the time required from the initiation of fabrication of interconnected multilayer boards until their completion.

(2) The manufacturing yield of computers can be improved. This is attributed to the fact that, because the number of steps for the fabrication of each interconnected multilayer board can be decreased to significant extent, the fabrication yield of interconnected multilayer boards is improved, eventually leading to improvements in the manufacturing yield of computers.

(3) Computers can be improved in both reliability and service life. These improvements are also attributed to the decrease in the number of steps for the fabrication of interconnected multilayer boards. For example, the number of interfaces between insulating layers has been decreased compared with the number of interfaces between insulating layers formed in accordance with the conventional stepwise formation. As a result, causes for reduced reliability, such as separation and impurity penetration at interfaces, have been rendered fewer.

(4) Speed-up of computers is feasible, as the present invention has facilitated the use of a low-dielectric-constant material, said material being capable of improving the delay of signal propagation, as an insulating material upon fabrication of interconnected multilayer boards. For example, the benzocyclobutene-containing resins employed as heat-resistant solventless varnishes in the above examples had a lower dielectric constant (2.4–2.7) compared to conventional polyimides whose dielectric constants are at least 3.0.

(5) Compared with the conventional fabrication process making use of a polyimide, the fabrication process of the present invention which uses a poly(benzocyclobutene) polymer or heat-resistant epoxy resin has excellent mass productivity such that the throughput can be improved 2–3 times and the lead time can be shorted to ½ to ⅓. To perform multilayer metallization of 15 layers, the conventional process requires at least 6 months while the process of the present invention easily allows to set up a fabrication schedule of 3 months or less. The present invention can therefore contribute to significant improvements in mass productivity. Further, the use of the poly(benzocyclobutene) polymer or heat-resistant epoxy resin in a solventless form permits easy formation of insulating layers which are free of voids or pinholes.

What is claimed is:

1. An interconnected multilayer board comprising a group of parallel conductor lines at least one of which overlies a base substrate, and another group of via conductors connected to the conductor lines and arranged perpendicular to the parallel conductor lines to provide a skeleton structure defining spaces between said conductors, the spaces defined by said conductor lines and said via conductors having been filled with a heat-resistant varnish in a solventless form and said varnish then being cured with said spaces.

2. The board of claim 1, wherein prior to filling of the spaces with the heat-resistant varnish, the conductor lines and the via conductors are coated with a solvent-based, heat-resistant varnish.

3. The board of claim 1, wherein the varnish comprises an epoxy resin, an isocyanurate-oxazolidone resin, a cyanate ester resin, or a hat-resistant polymer containing cyclobutene rings.

4. The board of claim 1, wherein the varnish in solventless form comprises an epoxy resin, an isocyanurate-oxazolidone resin, a cyanate ester resin, or a heat-resistant polymer containing cyclobutene rings.

5. An interconnected multilayer board comprising:
a base substrate;
a group of conductor lines;
a group of a plurality of via conductors each being connected to a predetermined conductor line to form a skeleton structure having spaces defined therein; and
an insulating material located in said spaces for insulating said conductor lines from one another, and for supporting said conductor lines;
said conductor lines being arranged at different levels of layers, and said conductor lines arranged at the respective layers being substantially parallel to said base substrate, each of said plurality of via conductors being fabricated in the form of a pillar, extending in a direction substantially perpendicular to said base substrate, and arranged in a position for supporting a conductive line to be connected by the terminal of the via conductor, said insulating material comprising a cured resin selected from the group consisting of a polymer of benzocyclobutene, an epoxy resin, a cyanate ester resin and a polyimide resin.

6. The interconnected multilayer board according to claim 5, wherein surfaces of the groups of conductive lines and via conductors are coated with a polymer whose permitivity is lower than that of said insulating material.

7. The interconnected multilayer board according to claim 5, wherein the conductive lines are straight lines.

8. The interconnected multilayer board according to claim 1, wherein said insulating material contains a reinforcing material.

9. The interconnected multilayer board according to claim 8, wherein said reinforcing material is at least one of a fibrous material or polyimide powder.

10. The interconnected multilayer board according to claim 9, wherein said fibrous material is Aramid fibers.

11. The interconnected multilayer board according to claim 6, wherein said insulating material contains a reinforcing material.

12. The interconnected multilayer board according to claim 11, wherein said reinforcing material is at least one of a fibrous material or polyimide powder.

13. The interconnected multilayer board according to claim 12, wherein said fibrous material is Aramid fibers.

14. The interconnected multilayer board according to claim 6, wherein the conductive lines are straight lines.

15. The interconnected multilayer board according to claim 7, wherein said insulating material contains a reinforcing material.

16. The interconnected multilayer board according to claim 15, wherein said reinforcing material is at least one of a fibrous material or polyimide powder.

17. The interconnected multilayer board according to claim 16, wherein said fibrous material is Aramid fibers.

18. The interconnected multilayer board according to claim 6, wherein said polymer is either one of fluorine polymer or polyimide.

19. The interconnected multilayer board according to claim 5, wherein the epoxy resin contains at least one type of rings selected from naphthalene rings, biphenyl rings, and terphenyl rings.

20. The interconnected multilayer board according to 19, wherein said epoxy resin is a tetrafunctional epoxy resin.

21. The interconnected multilayer board according to claim 5, wherein the epoxy resin contains at least one type of ring selected from naphthalene rings, biphenyl rings, and terphenyl rings, and is a tetrafunctional epoxy resin.

22. The interconnected multilayer board according to claim 5, wherein the epoxy resin contains an aromatic diamine as the curing agent.

23. The interconnected multilayer board according to claim 22, wherein the ring of the aromatic diamine contains at least one type of ring selected from naphthalene rings, biphenyl rings, and terphenyl rings.

24. The interconnected multilayer board according to claim 23, wherein surfaces of the groups of conductive lines and vias are coated with a polymer whose permitivity is lower than that of said insulating material.

25. The interconnected multilayer board according to claim 5, wherein said polymer of benzocyclobutene is a copolymer of a benzocyclobutene and a bismaleimide.

* * * * *